United States Patent
Arisawa et al.

(10) Patent No.: US 11,267,225 B2
(45) Date of Patent: Mar. 8, 2022

(54) METAL-CLAD LAMINATED BOARD, METHOD FOR PRODUCING METAL-CLAD LAMINATED BOARD, RESIN-ATTACHED METAL MEMBER, METHOD FOR PRODUCING RESIN-ATTACHED METAL MEMBER, WIRING BOARD AND METHOD FOR PRODUCING WIRING BOARD

(71) Applicant: Panasonic Intellectual Property Management Co., Ltd., Osaka (JP)

(72) Inventors: Tatsuya Arisawa, Fukushima (JP); Tomoyuki Abe, Fukushima (JP); Shunji Araki, Fukushima (JP); Yuki Inoue, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 628 days.

(21) Appl. No.: 16/071,071

(22) PCT Filed: Dec. 12, 2016

(86) PCT No.: PCT/JP2016/005105
§ 371 (c)(1),
(2) Date: Jul. 18, 2018

(87) PCT Pub. No.: WO2017/134716
PCT Pub. Date: Aug. 10, 2017

(65) Prior Publication Data
US 2019/0270280 A1 Sep. 5, 2019

(30) Foreign Application Priority Data
Feb. 5, 2016 (JP) .............................. JP2016-020811

(51) Int. Cl.
*B32B 15/092* (2006.01)
*B32B 37/18* (2006.01)
(Continued)

(52) U.S. Cl.
CPC ............ *B32B 15/092* (2013.01); *B32B 15/08* (2013.01); *B32B 37/182* (2013.01); *H05K 1/03* (2013.01);
(Continued)

(58) Field of Classification Search
CPC ..... B32B 15/092; B32B 15/08; B32B 37/182; B32B 2457/08; H05K 1/03; H05K 1/0353;
(Continued)

(56) References Cited

U.S. PATENT DOCUMENTS

| | | |
|---|---|---|
| 2015/0376444 A1 | 12/2015 | Saito et al. |
| 2017/0164469 A1 | 6/2017 | Kitai et al. |

FOREIGN PATENT DOCUMENTS

| | | |
|---|---|---|
| JP | 2004-025835 | 1/2004 |
| JP | 2016-006227 | 1/2016 |

(Continued)

OTHER PUBLICATIONS

Machine Translation of WO 2014/125763 (Year: 2014).*
(Continued)

*Primary Examiner* — Humera N. Sheikh
*Assistant Examiner* — John D Schneible
(74) *Attorney, Agent, or Firm* — Greenblum & Bernstein, P.L.C.

(57) ABSTRACT

A metal-clad laminated board includes an insulating layer and a metal layer in contact with at least one surface of the insulating layer. The insulating layer includes a cured product of a thermosetting resin composition containing a reaction product of a polyphenylene ether and an epoxy com-
(Continued)

pound. The polyphenylene ether has 1.5 to 2 hydroxyl groups on average in one molecule, and the epoxy compound has 2 to 2.3 epoxy groups on average in one molecule. In the metal-clad laminated board, the reaction product has a terminal hydroxyl group concentration of 700 μmol/g or less. The metal layer includes a metal substrate and a barrier layer containing cobalt. The barrier layer is provided on the metal substrate at a side close to a contact surface of the metal layer with the insulating layer. The contact surface has surface roughness of 2 μm or less in ten-point average roughness Rz.

15 Claims, 2 Drawing Sheets

(51) Int. Cl.
  *H05K 1/03* (2006.01)
  *H05K 1/09* (2006.01)
  *B32B 15/08* (2006.01)
(52) U.S. Cl.
  CPC ............. *H05K 1/0353* (2013.01); *H05K 1/09* (2013.01); *B32B 2457/08* (2013.01); *H05K 2201/0338* (2013.01); *Y10T 428/31511* (2015.04)

(58) Field of Classification Search
  CPC .............. H05K 1/09; H05K 2201/0338; Y10T 428/31511
  USPC ......................................................... 428/413
  See application file for complete search history.

(56) References Cited

FOREIGN PATENT DOCUMENTS

| WO | 2013/147116 | 10/2013 |
| WO | 2014/125763 | 8/2014 |
| WO | 2016/009611 | 1/2016 |

OTHER PUBLICATIONS

Machine Translation of WO 2016/009611 (Year: 2016).*
International Search Report of PCT application No. PCT/JP2016/005105 dated Mar. 7, 2017.

* cited by examiner

METAL-CLAD LAMINATED BOARD, METHOD FOR PRODUCING METAL-CLAD LAMINATED BOARD, RESIN-ATTACHED METAL MEMBER, METHOD FOR PRODUCING RESIN-ATTACHED METAL MEMBER, WIRING BOARD AND METHOD FOR PRODUCING WIRING BOARD

CROSS-REFERENCE TO RELATED APPLICATIONS

This application is a U.S. national stage application of the PCT International Application No. PCT/JP2016/005105 filed on Dec. 12, 2016, which claims the benefit of foreign priority of Japanese patent application No. 2016-020811 filed on Feb. 5, 2016, the contents all of which are incorporated herein by reference.

TECHNICAL FIELD

The present disclosure relates to a metal-clad laminated board, a method for producing a metal-clad laminated board, a resin-attached metal member, a method for producing a resin-attached metal member, a wiring board, and a method for producing a wiring board.

BACKGROUND

Along with an increase in amount of information to be processed, mounting techniques involving, for example, high integration of a semiconductor device to be incorporated, high density of wiring, and multilayering are rapidly developing in various electronic devices. For example, a wiring board compatible with high-frequency waves, such as a millimeter-wave radar substrate for in-vehicle use is also required.

When a signal is transmitted to wiring provided in a wiring board, for example, a transmission loss occurs due to a conductor that forms the wiring and due to a dielectric body around the wiring. This transmission loss has been known to particularly occur when a high-frequency signal is transmitted to wiring provided in a wiring board. Accordingly, the wiring board is required to reduce the loss during signal transmission in order to increase transmission speed of a signal. The wiring board compatible with high-frequency waves is particularly required to have this capability. In order to satisfy this requirement, a material having a low dielectric constant and a low dielectric dissipation factor is considered to be used as a substrate material for producing an insulating layer that constitutes a wiring board.

A metal-clad laminated board and a resin-attached metal member that are used to produce a wiring board or the like include not only the insulating layer but also a metal layer on the insulating layer. The wiring board also includes not only the insulating layer but also wiring on the insulating layer. The wiring is derived from the metal layer. For example, Unexamined Japanese Patent Pulication No. 2004-25835 discloses a metal-clad laminated board and a resin-attached metal member that are produced focusing on such a metal layer.

Unexamined Japanese Patent Pulication No. 2004-25835 discloses a metal-clad laminated board and a resin-attached metal foil that include an insulating resin composition layer and a metal foil fixed to one surface or both surfaces of the insulating resin composition layer. The metal foil is surface-treated at least on a side of the insulating resin composition layer and is not substantially roughened on both surfaces.

SUMMARY

Unexamined Japanese Patent Pulication No. 2004-25835 describes that it is possible to achieve both adhesiveness and flatness of an interface between the insulating resin composition layer and the metal foil and to also satisfy a practical element involving production of a printed wiring board.

On the other hand, the wiring board is further required to reduce the loss during signal transmission in order to further increase transmission speed of a signal. In order to satisfy this further requirement, various studies have been conducted for the metal-clad laminated board, the resin-attached metal member, and the wiring board.

The present disclosure has been made in view of the foregoing circumstances. The present disclosure provides a metal-clad laminated board and a resin-attached metal, which allow for the preferred production of a wiring board which has a reduced loss during signal transmission. Further, the present disclosure provides respective methods for producing a metal-clad laminated board and a resin-attached metal member, which allow for the preferred production of a wiring board which has a reduced loss during signal transmission. Further, the present disclosure provides a wiring board which has a reduced loss during signal transmission, and a production method therefor.

The inventors of the present disclosure have focused on wiring formed on an insulating layer in order to reduce a loss in a wiring board during signal transmission.

Specifically, the inventors of the present disclosure have inferred that high-frequency signals transmitted through wiring, due to a skin effect, concentrate around a surface of a conductor constituting the wiring. On the other hand, in a metal-clad laminated board, a resin-attached metal member, and a wiring board, roughening is known to be generally performed on a surface (contact surface) of a metal layer or wiring that is in contact with an insulating layer in order to increase adhesion strength of the metal layer or the wiring with the insulating layer. Even under these circumstances, the inventors of the present disclosure have studied reduction of surface roughness of the metal layer or the wiring. The inventors of the present disclosure have considered that the reduction of surface roughness flattens and smoothens the surface of the metal layer or the wiring so as to shorten transmission distance of a signal that flows around the surface of the wiring, which is derived from the metal layer. That is, the inventors of the present disclosure have found that it is possible to reduce the loss during signal transmission, even without changing a substrate material for producing the insulating layer of the wiring board, by increasing flatness and smoothness of the surface of the wiring that is in contact with the insulating layer, the wiring being formed on the insulating layer of the wiring board.

As the metal layer used in the metal-clad laminated board or the resin-attached metal member, a metal layer that has been plated with nickel having high heat resistance is generally used. The inventors of the present disclosure have studied application of cobalt, which is lower in electrical resistance than nickel, for a barrier layer formed by plating on the surface of the metal layer or the wiring because signals are considered to concentrate around the surface of a conductor constituting the wiring as described above.

Cobalt, however, is lower in heat resistance than nickel. Hence, the inventors of the present disclosure have studied usage of an insulating layer that includes a cured product obtained by curing a thermosetting resin composition containing a polyphenyl ether or an epoxy compound, which is excellent in heat resistance. The inventors of the present disclosure have considered that the usage of such an insulating layer allows a metal-clad laminated board obtained to sufficiently retain heat resistance, even when the metal layer that includes the barrier layer containing cobalt, which is lower in heat resistance than nickel, is used. That is because the insulating layer in contact with the metal layer has high heat resistance. In addition, the inventors of the present disclosure have considered that the cured product included in the insulating layer includes a component derived from a polyphenyl ether which is low in dielectric constant and dielectric dissipation factor, thereby making the dielectric characteristics of the obtained insulating layer excellent. Accordingly, the inventors of the present disclosure have considered that the metal-clad laminated board including such an insulating layer is capable of further reducing the loss during signal transmission.

Thus, the inventors of the present disclosure have found the present disclosure as a result of various studies described above.

A metal-clad laminated board according to an aspect of the present disclosure includes an insulating layer and a metal layer in contact with at least one surface of the insulating layer. The insulating layer includes a cured product of a thermosetting resin composition containing a reaction product of a polyphenylene ether and an epoxy compound, the polyphenylene ether having 1.5 to 2 hydroxyl groups on average in one molecule, the epoxy compound having 2 to 2.3 epoxy groups on average in one molecule. Further, the reaction product has a terminal hydroxyl group concentration of 700 μmol/g or less. And the metal layer includes a metal substrate and a barrier layer containing cobalt, the barrier layer being provided on the metal substrate at a side close to a contact surface of the metal layer with the insulating layer. And the contact surface has surface roughness of 2 μm or less in ten-point average roughness Rz.

This configuration can provide a metal-clad laminated board capable of suitably producing a wiring board having a reduced loss during signal transmission.

Such a metal-clad laminated board is considered to be provided for following reasons.

First, the metal layer in contact with the insulating layer, which serves as a wiring for a wiring board, is low in the surface roughness of the contact surface with the insulating layer as mentioned above, and thus high in the flatness and smoothness of the contact surface. Due to the reason described above, the wiring board obtained from this metal-clad laminated board is considered to be high in flatness and smoothness of an interface between the insulating layer and the wiring. This is considered to make it possible for the wiring provided in this wiring board to reduce the loss during signal transmission. Further, the metal layer includes, on the contact surface side, the barrier layer containing cobalt, which is lower in resistance than nickel. This feature is also considered to be capable of reducing the loss during signal transmission.

The insulating layer includes a cured product of the thermosetting resin composition. This thermosetting resin composition includes a reaction product obtained by reacting a polyphenylene ether which has excellent dielectric characteristics and heat resistance and an epoxy compound which has more excellent heat resistance. This reaction product is considered capable of also preferably exhibiting the excellent heat resistance of the epoxy compound while maintaining the excellent dielectric characteristics and heat resistance of the polyphenylene ether. Therefore, this insulating layer is considered to have excellent dielectric characteristics and heat resistance.

Cobalt is lower in heat resistance than nickel. Even when the barrier layer containing cobalt is low in heat resistance, it is considered to be possible to sufficiently retain excellent heat resistance of the insulting layer in the metal-clad laminated board obtained, because the insulating layer in contact with this barrier layer is excellent in heat resistance as described above. Due to the reason described above, even including the metal layer that has the barrier layer containing cobalt, which is low in heat resistance, the metal-clad laminated board is considered to be capable of sufficiently secure the heat resistance.

The reaction product, which refers to a reaction product of the polyphenylene ether and the epoxy compound, has a terminal hydroxyl group concentration of 700 μmol/g or less. More specifically, the reaction product is considered as a reaction product obtained by reacting the polyphenylene ether and the epoxy compound such that the terminal hydroxyl group concentration is 700 μmol/g or less. The cured product of the reaction product that has such a terminal hydroxyl group concentration is considered to enhance the adhesion to metals and the like. For this reason, the insulating layer is considered as a layer which has excellent adhesion to the metal layer. Further, the barrier layer containing cobalt is considered also excellent also in adhesion to the insulating layer. This is considered to make it possible to sufficiently secure the adhesion between the metal layer and the insulating layer even when the flatness and smoothness of the contact surface of the metal layer with the insulating layer are increased.

Due to the reasons described above, the metal-clad laminated board obtained is a metal-clad laminated board capable of suitably producing a wiring board having a reduced loss during signal transmission. Further, this metal-clad laminated board is adapted to not only allow the production of a wiring board which has a reduced loss during signal transmission, but also exhibit excellent heat resistance.

Further, in the metal-clad laminated board, the polyphenylene ether is preferably a compound represented by a following formula (1).

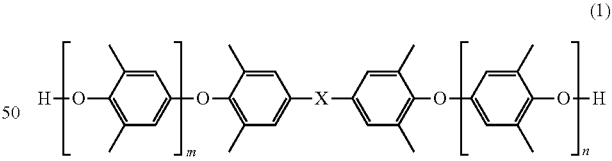

In the formula (1), X represents an alkylene group having 1 to 3 carbon atoms or a direct bond, m represents 0 to 20, n represents 0 to 20, and a total of m and n is from 1 to 30.

This configuration provides a metal-clad laminated board which allows for the preferred production of a wiring board which has a further reduced loss during signal transmission. This is believed to be because the insulating layer of the metal-clad laminated board serves as an insulating layer which has more excellent dielectric characteristics.

Further, in the metal-clad laminated board, the epoxy compound preferably contains 50% by mass or more of a dicyclopentadiene epoxy compound.

This configuration provides a metal-clad laminated board which allows for the preferred production of a wiring board which has a further reduced loss during signal transmission. This is believed to be because the insulating layer of the metal-clad laminated board serves as an insulating layer which has more excellent dielectric characteristics.

Further, in the metal-clad laminated board, the thermosetting resin composition preferably further contains a cyanate ester compound.

This configuration provides a metal-clad laminated board which allows for the preferred production of a wiring board which has more excellent heat resistance. Such a metal-clad laminated board is considered to be provided for following reasons. This cyanate ester compound is considered capable of reacting with the reaction product for the preferred formation of three-dimensional cross-linkage. Therefore, the insulating layer of the metal-clad laminated board is considered to serve as an insulating layer which has more excellent heat resistance.

Further, in the metal-clad laminated board, the thermosetting resin composition preferably further contains a halogen-based flame retardant.

This configuration can enhance the flame retardancy of the insulating layer of the metal-clad laminated board, and thus provides a metal-clad laminated board which allows for the preferred production of a wiring board which has more excellent flame retardancy.

Further, in the metal-clad laminated board, the halogen-based flame retardant is preferably a flame retardant to be dispersed without compatibilization in the thermosetting resin composition.

This configuration provides a metal-clad laminated board which allows for the preferred production of a wiring board which has more excellent flame retardancy, while reducing the loss during signal transmission.

Such a metal-clad laminated board is considered to be provided for following reasons.

The thermosetting resin composition contains a halogen-based flame retardant dispersed without compatibilization in this composition. Thermosetting resin compositions containing a common halogen-based flame retardant have sometimes given cured products with lowered heat resistance. Even when containing a halogen-based flame retardant that can lower the heat resistance, the thermosetting resin composition is considered to give, provided that such a halogen-based flame retardant used is the halogen-based flame retardant described above, a cured product excellent in flame retardancy while suppressing a decrease of excellent heat resistance of the reaction product.

Further, in the metal-clad laminated board, the halogen-based flame retardant preferably has a melting point of 300° C. or higher.

This configuration provides a metal-clad laminated board which has excellent flame retardancy and more excellent heat resistance. This is believed to be because the heat resistance and flame retardancy of the insulating layer are further enhanced.

Further, in the metal-clad laminated board, the halogen-based flame retardant is preferably at least one selected from the group consisting of ethylene dipentabromobenzene, ethylene bistetrabromoimide, decabromodiphenyloxide, tetradecabromodiphenoxybenzene, and bis(tribromophenoxy)ethane.

This configuration provides a metal-clad laminated board which has excellent flame retardancy and more excellent heat resistance. This is believed to be because the heat resistance and flame retardancy of the insulating layer are further enhanced.

Further, in the metal-clad laminated board, the thermosetting resin composition preferably further contains an organometallic salt.

This configuration provides a metal-clad laminated board that which has more excellent heat resistance. Such a metal-clad laminated board is considered to be provided for following reasons. The organometallic salt is believed to act as a curing accelerator that accelerates the curing reaction (cross-linking reaction) of the reaction product and the curing reaction (cross-linking reaction) between the reaction product and the cyanate ester compound. Further, the use of the organometallic salt as a curing accelerator is considered to provide a high heat-resistance cured product. Therefore, a metal-clad laminated board which has more excellent heat resistance is considered to be obtained.

Further, in the metal-clad laminated board, the thermosetting resin composition preferably further contains an inorganic filler.

This configuration provides a metal-clad laminated board which enhances dimensional stability on heating, and has excellent flame retardancy.

Further, a method for producing a metal-clad laminated board according to another aspect of the present disclosure includes a step of preparing a thermosetting resin composition containing a reaction product obtained by reacting at least a part of a polyphenylene ether having 1.5 to 2 hydroxyl groups on average in one molecule with an epoxy group of an epoxy compound having 2 to 2.3 epoxy groups on average in one molecule so that the terminal hydroxyl group concentration is 700 μmol/g or less. Furthermore, the method includes a step of preparing a prepreg by impregnating a fibrous substrate with the thermosetting resin composition, and a step of obtaining a metal-clad laminated board including an insulating layer and a metal layer in contact with at least one surface of the insulating layer by laminating the metal layer on the prepreg, followed by heat pressure molding, the insulating layer including a cured product of the thermosetting resin composition. And the metal layer includes a metal substrate and a barrier layer containing cobalt, the barrier layer being provided on the metal substrate at a side close to a contact surface of the metal layer with the insulating layer The contact surface has surface roughness of 2 μm or less in ten-point average roughness Rz.

According to this configuration, a metal-clad laminated board can be produced which allows for the preferred production of a wiring board which has a reduced loss during signal transmission.

Further, a resin-attached metal member according to another aspect of the present disclosure includes an insulating layer and a metal layer in contact with one surface of the insulating layer. The insulating layer includes a half-cured product of a thermosetting resin composition containing a reaction product of a polyphenylene ether and an epoxy compound, the polyphenylene ether having 1.5 to 2 hydroxyl groups on average in one molecule, the epoxy compound having 2 to 2.3 epoxy groups on average in one molecule. Furthermore, the reaction product has a terminal hydroxyl group concentration of 700 μmol/g or less. The metal layer includes a metal substrate and a barrier layer containing cobalt, the barrier layer being provided on the metal substrate at a side close to a contact surface of the metal layer with the insulating layer. And the contact surface has surface roughness of 2 μm or less in ten-point average roughness Rz.

This configuration can provide a resin-attached metal member which allows for the preferred production of a wiring board which has a reduced loss during signal transmission. Further, this resin-attached metal member is adapted to not only allow the preferred production of a wiring board which has a reduced loss during signal transmission, but also exhibit excellent heat resistance.

Further, a method for producing a resin-attached metal member according to another aspect of the present disclosure includes a step of preparing a thermosetting resin composition containing a reaction product obtained by reacting at least a part of a polyphenylene ether having 1.5 to 2 hydroxyl groups on average in one molecule with an epoxy group of an epoxy compound having 2 to 2.3 epoxy groups on average in one molecule so that a terminal hydroxyl group concentration is 700 µmol/g or less. Furthermore, the method includes a step of obtaining a resin-attached metal member including an insulating layer and a metal layer in contact with one surface of the insulating layer by forming the thermosetting resin composition into a layer form on one surface of the metal layer, the insulating layer including a half-cured product of the thermosetting resin composition. And, the metal layer includes a metal substrate and a barrier layer containing cobalt, the barrier layer being provided on the metal substrate at a side close to a contact surface of the metal layer with the insulating layer. The contact surface has surface roughness of 2 µm or less in ten-point average roughness Rz.

This configuration can produce a resin-attached metal member, which allows for the preferred production of a wiring board which has a reduced loss during signal transmission.

Further, a wiring board according to another aspect of the present disclosure includes an insulating layer and a wiring in contact with at least one surface of the insulating layer. The insulating layer includes a cured product of a thermosetting resin composition containing a reaction product of a polyphenylene ether and an epoxy compound, the polyphenylene ether having 1.5 to 2 hydroxyl groups on average in one molecule, the epoxy compound having 2 to 2.3 epoxy groups on average in one molecule. Furthermore, the reaction product has a terminal hydroxyl group concentration of 700 µmol/g or less. The wiring includes a metal substrate and a barrier layer containing cobalt, the barrier layer being provided on the metal substrate at a side close to a contact surface of the wiring with the insulating layer. And the contact surface has surface roughness of 2 µm or less in ten-point average roughness Rz.

This configuration can provide a wiring board which has a reduced loss during signal transmission. Further, this wiring board is adapted to not only reduce the loss during signal transmission, but also exhibit excellent heat resistance.

Further, a method for producing a wiring board according to another aspect of the present disclosure includes a step of obtaining a wiring board by using the metal-clad laminated board or by using the resin-attached metal member.

This configuration can produce a wiring board which has a reduced loss during signal transmission.

According to the present disclosure, a metal-clad laminated board and a resin-attached metal member can be provided which allow for the preferred production of a wiring board which has a reduced loss during signal transmission. Further, according to the present disclosure, respective methods for producing a metal-clad laminated board and a resin-attached metal member can be provided, which allow for the preferred production of a wiring board which has a reduced loss during signal transmission. Further, according to the present disclosure, a wiring board which has a reduced loss during signal transmission and a production method therefor can be provided.

DESCRIPTION OF EMBODIMENTS

Hereinafter, exemplary embodiments according to the present disclosure are described. The present disclosure, however, is not limited to these exemplary embodiments.

Figure 1:
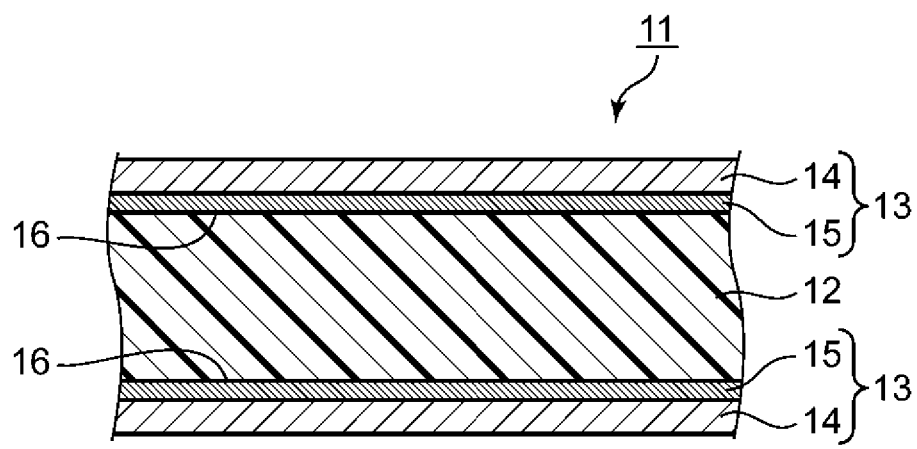
FIG. 1 is a cross-sectional view illustrating a configuration of a metal-clad laminated board according to one exemplary embodiment of the present disclosure.

A metal-clad laminated board according to one exemplary embodiment of the present disclosure includes an insulating layer and a metal layer in contact with at least one surface of the insulating layer. This metal-clad laminated board 11 includes, as illustrated in FIG. 1, insulating layer 12 and metal layer 13 disposed in contact with both surfaces of the insulating layer. Alternatively, the metal-clad laminated board may include the metal layer disposed in contact with only one surface of the insulating layer. FIG. 1 is a cross-sectional view illustrating a configuration of metal-clad laminated board 11 according to the present exemplary embodiment.

Insulating layer 12 includes a cured product of a thermosetting resin composition containing a reaction product of a polyphenylene ether and an epoxy compound. The polyphenylene ether has 1.5 to 2 hydroxyl groups on average in one molecule. The epoxy compound has 2 to 2.3 epoxy groups on average in one molecule. Further, the reaction product has a terminal hydroxyl group concentration of 700 µmol/g or less. The cured product included in the insulating layer is not particularly limited, as long as the cured product is obtained by curing the thermosetting resin composition. In addition, the insulating layer may include not only the cured product of the thermosetting resin composition but also a fibrous substrate. The fibrous substrate is preferably included in terms of increasing, for example, strength and heat resistance. Specifically, the insulating layer including the fibrous substrate is, for example, a layer obtained by impregnating the fibrous substrate with the thermosetting resin composition and curing the thermosetting resin composition with which the fibrous substrate has been impregnated.

Insulating layer 12 includes a cured product of a thermosetting resin composition. This thermosetting resin composition includes a reaction product of a polyphenylene ether and an epoxy compound. The polyphenylene ether has excellent dielectric characteristics and heat resistance. The epoxy compound has more excellent heat resistance. The insulating layer of the thermosetting resin composition, which includes the cured product, has excellent dielectric characteristics and heat resistance. This is believed to be because the reaction product is capable of also favorably exhibiting the excellent heat resistance of the epoxy compound while the reaction product is maintaining the excellent dielectric characteristics and heat resistance of the polyphenylene ether. In addition, the insulating layer is a layer which has excellent adhesion to metal layer 13. This is believed to be because the adhesion to the metal is enhanced by the cured product of the reaction product obtained by reacting the polyphenylene ether and the epoxy compound such that the terminal hydroxyl group concentration is 700 µmol/g or less.

Metal layer 13 includes metal substrate 14 and barrier layer 15 provided on the metal substrate at a side close to contact surface 16 of metal layer 13 with insulating layer 12. Metal layer 13 includes, as illustrated in FIG. 1, metal substrate 14 and barrier layer 15 provided on the metal substrate at a side close to contact surface 16 of metal substrate 14 with insulating layer 12. Alternatively, the metal layer may include the barrier layer on both surfaces of the metal substrate. In addition, contact surface 16 has surface roughness of 2 µm or less in ten-point average roughness Rz.

Metal layer 13 is in contact with insulating layer 12. More specifically, insulating layer 12 is in contact with barrier layer 15 of metal layer 13. When a wiring board is produced from metal-clad laminated board 11, metal layer 13 is to be wiring of the wiring board. Metal layer 13 which can serve as a wiring is low in the surface roughness of contact surface 16 with insulating layer 12 as described above, and thus the contact surface of the wiring with the insulating layer thus also has low surface roughness. For the foregoing reason, the wiring board obtained from metal-clad laminated board 11 is considered high in flatness and smoothness of an interface between the insulating layer and the wiring. For this reason, the wiring board is considered to reduce a conductor loss generated by contact of the wiring with the insulating layer. Accordingly, metal-clad laminated board 11 is considered to give a wiring board having a reduced loss during signal transmission.

Further, metal layer 13 includes, as described above, barrier layer 15 containing cobalt at a side closer to contact surface 16. This feature is also considered to be capable of reducing the loss during signal transmission. Further, barrier layer 15 containing cobalt is considered to be excellent in adhesiveness with insulating layer 12. In addition, insulating layer 12 is also, as described above, considered to have excellent adhesion to metal layer 13. From the foregoing, it is believed that the adhesion between metal layer 13 and insulating layer 12 can be sufficiently secured even in the case of enhancing the flatness and smoothness of contact surface 16 of metal layer 13 with insulating layer 12. Accordingly, the wiring board produced with the use of metal-clad laminated board 11 can prevent the wiring from peeling from the insulating layer. Also from this viewpoint, metal-clad laminated board 11 allows for the production of a preferred wiring board.

Due to the reasons described above, metal-clad laminated board 11 obtained is a metal-clad laminated board which allows for the preferred production of a wiring board which has a reduced loss during signal transmission. Further, metal-clad laminated board 11 is adapted to not only allow the preferred production of a wiring board which has a reduced loss during signal transmission, but also exhibit excellent heat resistance adequately.

Contact surface 16 of metal layer 13 has a surface roughness of 2 µm or less as described above, preferably 1.5 µm or less, more preferably 1 µm or less. Contact surface 16 having a lower surface roughness, that is, metal layer 13 having higher flatness and smoothness is, as described above, preferable in terms of being capable of reducing the loss during signal transmission. On the other hand, even when the surface roughness of contact surface 16 is decreased, the lower limit of the surface roughness of contact surface 16 is around 0.5 µm in ten-point average roughness Rz. When contact surface 16 is excessively low in surface roughness, the adhesion between metal layer 13 and insulating layer 12 tends to be decreased, even with the barrier layer containing cobalt. Also from this viewpoint, contact surface 16 preferably has surface roughness of 0.5 µm or more in ten-point average roughness Rz. Accordingly, contact surface 16 has surface roughness of preferably from 0.5 µm to 2 µm, inclusive, more preferably from 0.6 µm to 1.5 µm, inclusive, further preferably from 0.6 µm to 1 µm, inclusive, in ten-point average roughness Rz. Metal layer 13 includes metal substrate 14 and barrier layer 15 containing cobalt provided at the contact surface 16 side of metal substrate 14, and the surface roughness of contact surface 16 is thus surface roughness of barrier layer 15. Surface roughness of metal substrate 14 is not particularly limited. When the surface roughness of metal layer 13 is not remarkably changed even with barrier layer 15 formed, the surface roughness of metal substrate 14 is preferably equivalent to the surface roughness of contact surface 16 (barrier layer 15).

Metal substrate 14 is not particularly limited, as long as the metal substrate is used as the metal layer of the metal-clad laminated board. Specifically, examples of metal substrate 14 include metal foils such as a copper foil, a nickel foil, and an aluminum foil. Especially, a copper foil is preferably used as metal substrate 14.

Barrier layer 15 is not particularly limited as long as the barrier layer is a layer containing cobalt. Barrier layer 15 necessarily contains cobalt. Although the barrier layer may contain a metal other than cobalt (another metal) to the extent of not impairing effects of the present disclosure, the barrier layer is preferably a layer made of cobalt. Examples of barrier layer 15 include a rust preventive layer made of cobalt and a rust preventive layer containing cobalt. Examples of the other metal include nickel, tin, zinc, and chromium. The barrier layer, however, preferably contains neither nickel nor tin that has high electrical resistance. Alternatively, examples of barrier layer 15 include a layer formed by plating metal substrate (metal foil) 14. Examples of this plating include sputtering, electrolytic plating, and non-electrolytic plating using cobalt or an alloy containing cobalt. In the meantime, metal substrate (metal foil) 14 such as a copper foil may be subjected to rust-proofing such as chromating in order to prevent surface oxidation, before formation of the above-described barrier layer containing cobalt.

Thickness of metal layer 13 is not particularly limited, and would be changed according to, for example, performance required of the wiring board finally obtained. The thickness of metal layer 13 preferably ranges from 12 µm to 70 µm, inclusive, for example.

As metal layer 13, a commercially available metal layer can be also used. Examples of the commercially available metal layer include a cobalt-plated copper foil produced by Fukuda Metal Foil & Powder Co., Ltd. More specifically, examples include T9FZ-SV [Rz: 1.6 µm, thickness: 18 µm] and T9DA-SV [Rz: 1.0 µm, thickness: 18 µm] both produced by Fukuda Metal Foil & Powder Co., Ltd.

The cured product included in insulating layer 12 is obtained by curing the thermosetting resin composition as described above. In addition, the thermosetting resin composition includes the reaction product of the polyphenylene ether and the epoxy compound. The thermosetting resin composition is obtained by, for example, reacting in advance (preliminary reaction: pre-reaction) the polyphenylene ether and the epoxy compound, and then if necessary, blending other components. More specifically, the composition is obtained by reacting in advance (pre-reacting) at least some hydroxyl groups of the polyphenylene ether with epoxy groups of the epoxy compound, and then if necessary, blending other components. The reaction product and other respective components included in this thermosetting resin composition are described below. In addition, the thermosetting resin composition has only to include a reaction product obtained by preliminarily reacting the polyphenylene ether and the epoxy compound, and may include the polyphenylene ether and the epoxy compound which have not been used for the preliminary reaction.

The reaction product is not particularly limited, as long as the reaction product refers to a reaction product of the polyphenylene ether and the epoxy compound, and has a terminal hydroxyl group concentration of 700 μmol/g or less. Examples of the reaction product include a reaction product obtained by reacting at least some hydroxyl groups of the polyphenylene ether with epoxy groups of the epoxy compound such that the terminal hydroxyl group concentration is 700 μmol/g or less. In addition, the reaction product has only to have a terminal hydroxyl group concentration of 700 μmol/g or less, and may have a low terminal hydroxyl group concentration, which may be 0 μmol/g. However, in the reaction between the polyphenylene ether and the epoxy compound, in view of the reaction time, reaction efficiency, and side-reaction influence, the terminal hydroxyl group concentration is preferably 5 μmol/g or more. Therefore, the terminal hydroxyl group concentration of the reaction product is 0 μmol/g to 700 μmol/g, inclusive, preferably 5 μmol/g to 700 μmol/g, inclusive, and more preferably 10 μmol/g to 700 μmol/g, inclusive. By using thermosetting resin composition containing the reaction product at such a terminal hydroxyl group concentration, the cured product which has excellent adhesion to the metal layer while maintaining excellent dielectric characteristics and heat resistance can be obtained. Further, as long as the terminal hydroxyl group concentration of the polyphenylene ether falls within the range mentioned above, the thermosetting resin composition for making a cured product which has excellent adhesion to the metal layer while maintaining excellent dielectric characteristics and heat resistance can be obtained. This is believed to be because a reaction product with a terminal hydroxyl group concentration of 700 μmol/g or less is easily obtained, when the terminal hydroxyl group concentration of the polyphenylene ether falls within the range mentioned above. It is to be noted that the terminal hydroxyl group concentration of the reaction product refers to the ratio of a molar number of terminal hydroxyl groups to the mass of the reaction product.

The terminal hydroxyl group concentration can be regulated by adjusting reaction conditions such as the reaction temperature, the reaction time, the catalyst amount, and solid content concentration for the reaction. Specifically, the reaction product is obtained by reaction as follows. First, the polyphenylene ether and the epoxy compound are mixed by stirring in an organic solvent with a solid content concentration of 50% to 70% for approximately 10 minutes to 60 minutes, such that the polyphenylene ether and the epoxy compound meet a predetermined ratio. Then, the polyphenylene ether and the epoxy compound are mixed, and thereafter, heated at 80° C. to 110° C. for 2 to 12 hours. Thus, the polyphenylene ether and the epoxy compound are reacted to obtain a reaction product. It is to be noted that the organic solvent is not particularly limited, as long as the organic solvent dissolves the polyphenylene ether, the epoxy compound, and the like, but does not inhibit the reaction therebetween. Specific examples include toluene.

It is to be noted that the ratio between the polyphenylene ether and the epoxy compound that are pre-reacted is not particularly limited, for example, as long as the ratio by mol between the hydroxyl groups of the polyphenylene ether and the epoxy groups of the epoxy compound is such a ratio by mol at which a reaction product is obtained as mentioned above. Specifically, as the ratio by mol between the hydroxyl groups of the polyphenylene ether and the epoxy groups of the epoxy compound, the ratio (epoxy groups/hydroxyl groups) of the epoxy groups to the hydroxyl groups is preferably 3 to 6, inclusive, more preferably 3.5 to 5.5, inclusive. As long as the ratio by mol falls within the foregoing range, the epoxy compound is efficiently reacted with both terminals of the polyphenylene ether. Furthermore, the decreased viscosity of the reaction product can decrease the viscosity of a resin varnish or prepreg as described later, which is believed to improve manufacturability. On the other hand, the excessively increased ratio by mol has the possibility of decreasing the reaction efficiency, or degrading dielectric characteristics due to the decreased amount of the polyphenylene ether in the composition. In addition, the excessively low ratio by mol increases the possibility of reacting one molecule of the epoxy compound with two molecules of the polyphenylene ether, or the possibility of developing a reaction between the epoxy and the polyphenylene ether while forming a straight chain, and also has the possibility of increasing the viscosity of the reaction product, or decreasing the efficiency of reacting both terminals of the polyphenylene ether with epoxy compound.

In reacting the polyphenylene ether and the epoxy compound, the mixture of the polyphenylene ether and the epoxy compound may be mixed with a catalyst. The catalyst is not particularly limited, as long as the catalyst can accelerate the reaction between the hydroxyl groups of the polyphenylene ether and the epoxy groups of the epoxy compound. Examples of the catalyst specifically include organometallic salts of, e.g., Zn, Cu, and Fe with organic acids such as octanoic acid, stearic acid, acetylacetonate, naphthenic acid, and salicylic acid; tertiary amines such as 1,8-diazabicyclo[5.4.0]undecene-7 (DBU), triethylamine, and triethanolamine; imidazoles such as 2-ethyl-4-imidazole (2E4MZ) and 4-methylimidazole; and organic phosphines such as triphenylphosphine (TPP), tributylphosphine, and tetraphenylphosphonium tetraphenylborate. These may be used alone or in combination of two or more. Among these examples, the imidazoles, in particular, 2-ethyl-4-imidazole is used in a particularly preferred manner, in that the reaction time can be shortened, and furthermore, in that the polymerization between the epoxy compounds (self-polymerization of the epoxy compound) can be inhibited. Further, the content of the catalyst is preferably 0.05 parts by mass to 1 part by mass, inclusive, with respect to 100 parts by mass of total of the polyphenylene ether and the epoxy compound. When the content of the catalyst is excessively low, there is a tendency to take so much time to develop the reaction between the hydroxyl groups of the polyphenylene ether and the epoxy groups of the epoxy compound. Alternatively, when the content of the catalyst is excessively high, there is a tendency to make it difficult to control the reaction, thereby making gelation more likely to be caused.

The solid content concentration for the reaction is preferably approximately 50% to 70%, inclusive, in consideration of the reaction efficiency and the viscosity (manufacturability).

The polyphenylene ether is not particularly limited, as long as the polyphenylene ether has 1.5 to 2 hydroxyl groups on average in one molecule. The phrase "having 1.5 to 2 hydroxyl groups on average in one molecule" means that an average number of hydroxyl groups (average number of hydroxyl groups) per molecule of the polyphenylene ether is 1.5 to 2. Further, the average number of hydroxyl groups is 1.5 to 2, inclusive, preferably 1.6 to 2, inclusive, and more preferably 1.7 to 2, inclusive. When the average number of hydroxyl groups is excessively small, there is a tendency to fail to sufficiently enhance the heat resistance of a cured product of the thermosetting resin composition, or fail to sufficiently enhance the adhesion to a metal such as the metal layer. This is believed to be because the polyphenylene ether is made less likely to react with epoxy groups of the epoxy compound, and because the reaction with the epoxy compound makes three-dimensional cross-linking less likely to be formed in a preferred fashion. Alternatively, when the average number of hydroxyl groups is excessively large, there is a tendency to make it difficult to obtain the preferred thermosetting resin composition, such as gelation during the preliminary reaction between the polyphenylene ether and the epoxy compound. Thus, when the average number of hydroxyl groups falls within the range mentioned above, the thermosetting resin composition for making a cured product with excellent heat resistance sufficiently and excellent adhesion to a metal such as the metal layer can be obtained in a preferred manner.

It is to be noted that the average number of hydroxyl groups in the polyphenylene ether herein is known from, for example, a standard value for the product of the polyphenylene ether used. Examples of the average number of hydroxyl groups in the polyphenylene ether specifically include the average value for hydroxyl groups per molecule for all of the polyphenylene ether present in 1 mol of the polyphenylene ether.

The terminal hydroxyl group concentration of the polyphenylene ether is preferably 900 μmol/g to 2500 μmol/g, inclusive, more preferably 950 μmol/g to 2500 μmol/g, inclusive, and further preferably 1000 μmol/g to 2500 μmol/g, inclusive. As long as the terminal hydroxyl group concentration of the polyphenylene ether falls within the range mentioned above, a thermosetting resin composition for making a cured product with excellent adhesion to the metal layer can be obtained, while maintaining excellent dielectric characteristics and heat resistance. This is believed to be because a reaction product with a terminal hydroxyl group concentration of 700 μmol/g or less is likely to be obtained, as long as the terminal hydroxyl group concentration of the polyphenylene ether falls within the range mentioned above. It is to be noted that the terminal hydroxyl group concentration of the polyphenylene ether refers to the ratio of the molar number of terminal hydroxyl groups to the mass of the polyphenylene ether.

The polyphenylene ether has a weight-average molecular weight (Mw) of preferably 5000 or less, more preferably 2000 to 5000, inclusive, more preferably 2000 to 4000, inclusive. The polyphenylene ether with an excessively small molecular weight tends to provide a cured product which has insufficient heat resistance. On the other hand, the polyphenylene ether with an excessively large molecular weight tends to increase the melt viscosity, thereby failing to obtain sufficient flowability and failing prevent a molding defect. In addition, there is a tendency to be less likely to obtain a preferred thermosetting resin composition, such as due to gelation during the preliminary reaction of the polyphenylene ether and the epoxy compound. Accordingly, as long as the polyphenylene ether has a weight-average molecular weight within the range mentioned above, an excellent metal-clad laminated board including a preferred insulating layer which is more excellent in heat resistance of a cured product is obtained while the insulating layer retaining excellent dielectric characteristics of the polyphenylene ether.

Further, the weight-average molecular weight can be measured, specifically with use of gel permeation chromatography, for example.

The polyphenylene ether may be obtained by a polymerization reaction or may be obtained by subjecting a high-molecular-weight polyphenylene ether having a weight-average molecular weight ranging from about 10000 to 30000 to a redistribution reaction. Examples of the polyphenylene ether obtained by the redistribution reaction include a polyphenylene ether obtained by heating a high-molecular-weight polyphenylene ether in a solvent such as toluene in presence of a phenol compound and a radical initiator to cause the redistribution reaction. Such a polyphenylene ether obtained by the redistribution reaction has on both terminals of a molecular chain a hydroxy group that contributes to curing and is derived from the phenol-based compound, so that this polyphenylene ether is preferable in terms of retaining further high heat resistance. On the other hand, the polyphenylene ether obtained by the polymerization reaction is preferable in terms of exhibiting excellent flowability.

The molecular weight of the polyphenylene ether can be adjusted by adjusting polymerization conditions and the like, for example, in the case of the polyphenylene ether obtained by the polymerization reaction. On the other hand, for a case of the polyphenylene ether obtained by the redistribution reaction, for example, conditions for the redistribution reaction can be adjusted to adjust the molecular weight of the polyphenylene ether obtained. More specifically, it is considered, for example, to adjust a blending amount of the phenol-based compound used in the redistribution reaction. That is, the larger the blending amount of the phenol-based compound is, the smaller the molecular weight of the polyphenylene ether obtained is.

Examples of the polyphenylene ether specifically include those containing, as their main constituent, polyphenylene ether, such as polyphenylene ether composed of 2,6-dimethylphenol and at least any one of a bifunctional phenol and a trifunctional phenol, or poly(2,6-dimethyl-1,4-phenylene ether). Further, in the case of the polyphenylene ether obtained by the redistribution reaction, examples include a polyphenylene ether obtained using poly(2,6-dimethyl-1,4-phenylene ether) as the high-molecular-weight polyphenylene ether. The phenol-based compound used in the redistribution reaction is not particularly limited, but preferably used are, for example, polyfunctional phenol-based compounds having two or more phenolic hydroxy groups in a molecule, such as bisphenol A, phenol novolac, and cresol novolac. These may be used alone or in combination of two or more. Among the examples mentioned above, the polyphenylene ether composed of 2,6-dimethylphenol and at least any one of a bifunctional phenol and a trifunctional phenol is preferred as the polyphenylene ether. Further, examples of the bifunctional phenol include tetramethyl bisphenol A. More specifically, examples of the polyphenylene ether include compounds represented by the following general formula (1).

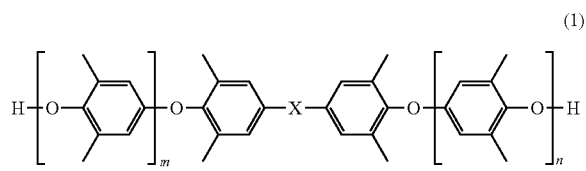

(1)

In the formula (1), m and n can be values that give a degree of polymerization such that the weight-average molecular weight (Mw) falls within the range mentioned above. Specifically, a total value of m and n preferably ranges from 1 to 30. Also, m preferably ranges from 0 to 20, and n preferably ranges from 0 to 20. Furthermore, in the formula (1), X represents an alkylene group having 1 to 3 carbon atoms, or a direct bond.

The epoxy compound is not particularly limited as long as the epoxy compound has 2 to 2.3 epoxy groups on average in one molecule. The phrase "having 2 to 2.3 epoxy groups on average in one molecule" means that the average number of epoxy groups per molecule of the epoxy compound (average number of epoxy groups) is 2 to 2.3. Further, the average number of epoxy groups is 2 to 2.3, inclusive, and preferably 2.1 to 2.3, inclusive. When the average number of epoxy groups is excessively small, there is a tendency to fail to sufficiently enhance the heat resistance of a cured product of the thermosetting resin composition. This is believed to be because the epoxy compound is made less likely to react with hydroxyl groups of the polyphenylene ether, and because the reaction with the polyphenylene ether makes three-dimensional cross-linking less likely to be formed in a preferred fashion. In addition, when the average number of epoxy groups is excessively large, there is a tendency to be less likely to obtain a preferred thermosetting resin composition, such as due to gelation during the preliminary reaction of the polyphenylene ether and the epoxy compound. From the foregoing, when the average number of epoxy groups falls within the range mentioned above, a thermosetting resin composition for making a cured product with sufficiently excellent heat resistance is obtained in a preferred manner.

It is to be noted that the average number of epoxy groups in the epoxy compound herein is known from, for example, a standard value for the product of the epoxy compound used. Examples of the average number of epoxy groups in the epoxy compound specifically include the average value for epoxy groups per molecule for all of the epoxy compound present in 1 mol of the epoxy compound.

The number-average molecular weight (Mn) of the epoxy compound is preferably 1000 or less, preferably 300 or more, and more preferably 400 to 800, inclusive. The thermosetting resin composition including such an epoxy compound suitably gives the insulating layer which is excellent in flame retardancy and heat resistance while maintaining excellent dielectric characteristics of the polyphenylene ether.

It is to be noted that the number-average molecular weight herein can be measured, specifically, with the use of gel permeation chromatography, for example.

The epoxy compound is preferably an epoxy compound containing no halogen atom in a molecule (non-halogen-based epoxy compound). When the thermosetting resin composition contains an epoxy compound having a halogen atom in a molecule (halogen-based epoxy compound), such as a brominated epoxy compound, the flame retardancy of the cured product of the thermosetting resin composition can be increased. Thus, the halogen-based epoxy compound is considered to be added to the thermosetting resin composition in order to increase the flame retardancy. However, this addition of the halogen-based epoxy compound has sometimes decreased the heat resistance of the cured product while increasing the flame retardancy of the cured product. In the case of the metal-clad laminated board according to the present exemplary embodiment, the insulating layer obtained includes the cured product of the thermosetting resin composition containing the halogen-based flame retardant. Hence, the insulating layer is considered to serve as an insulating layer capable of exhibiting the flame retardancy while keeping the heat resistance from being decreased. For this reason, the metal-clad laminated board is considered including the insulating layer which is excellent in heat resistance and flame retardancy.

Examples of the epoxy compound include a dicyclopentadiene epoxy compound, a bisphenol A epoxy compound, a bisphenol F epoxy compound, a phenol-novolac epoxy compound, a naphthalene epoxy compound, and a biphenyl epoxy compound. These may be used alone or in combination of two or more. Among the exemplified compounds, the epoxy compound is preferably a dicyclopentadiene epoxy compound, a bisphenol F epoxy compound, a bisphenol A epoxy compound, or a biphenyl epoxy compound, more preferably a dicyclopentadiene epoxy compound. Further, the epoxy compound preferably contains 50% by mass or more of a dicyclopentadiene-type epoxy compound. Such an epoxy compound gives the metal-clad laminated board including the preferred insulating layer which is more excellent in heat resistance while maintaining the excellent dielectric characteristics of the polyphenylene ether. This is believed to be because the epoxy compound has high compatibility with the polyphenylene ether.

The solubility of the epoxy compound in toluene is preferably 10% by mass or more at 25° C. Such an epoxy compound enhances the heat resistance of the cured product while maintaining excellent dielectric characteristics of the polyphenylene ether. This is believed to be because the epoxy compound is high in compatibility with the polyphenylene ether, and thus likely to react homogeneously with the polyphenylene ether.

The resin composition according to the present embodiment can contain other epoxy compounds, besides the epoxy compound for the reaction product. As the other epoxy compounds, epoxy compounds that have 2 to 2.3 epoxy groups on average in one molecule can be used as with the epoxy compound for the reaction product. Examples of the other epoxy compounds include a dicyclopentadiene epoxy resin, a bisphenol A epoxy resin, a bisphenol F epoxy resin, a phenol-novolac epoxy resin, a naphthalene epoxy resin, and a biphenyl epoxy resin. These may be used alone or in combination of two or more. In this case, the other epoxy compounds may be the same as or different from the epoxy compound for the reaction product. From the viewpoint of improving dielectric characteristics, the dicyclopentadiene epoxy resin is preferably used. Besides the epoxy compounds having 2 to 2.3 epoxy groups on average in one molecule, multifunctional (more than 2.3 epoxy groups on average in one molecule) epoxy compounds such as cresol novolac epoxy resins can be also used as the other epoxy compounds.

It is to be noted that in the case of including a dicyclopentadiene epoxy resin as any epoxy resin of the epoxy compound for the reaction product and the other epoxy compounds, it is preferable to contain the dicyclopentadiene epoxy resin such that the dicyclopentadiene epoxy compound is 50% by mass or more with respect to the total mass of the foregoing epoxy compounds. Thus, an insulating material can be obtained which has more excellent dielectric characteristics.

The thermosetting resin composition for use in the present embodiment has only to include the reaction product, and may include other components. Examples of the other components include a cyanate ester compound, a flame retardant, a curing catalyst, and a filler.

The cyanate ester compound is not particularly limited. The cyanate ester compound is a component that acts as not only a curing agent for the epoxy compound and the polyphenylene ether but also the curing agent of the reaction product to form a rigid skeleton. For this reason, the cyanate ester compound can impart a high glass transition temperature to the cured product of the thermosetting resin composition. In addition, because of low viscosity, the cyanate ester compound allows the obtained thermosetting resin composition to maintain high flowability. The cyanate ester compound undergoes self-polymerization between molecules of the cyanate ester compound in presence of a curing catalyst. This self-polymerization reaction progresses by forming a triazine ring through a reaction between cyanate groups to cause a polymerization reaction. Such a self-polymerization reaction contributes to improvement of heat resistance.

As the cyanate ester compound, it is preferable to use, for example, a compound where the average number of cyanate groups per molecule (average number of cyanate groups) is two or more. Such a cyanate ester compound having many cyanate groups is preferable in terms of increasing the heat resistance of the cured product of the thermosetting resin composition obtained. It is to be noted that the average number of cyanate groups in the cyanate ester compound herein is known from the standard value for the product of the cyanate resin used. Examples of the number of cyanate groups in the cyanate ester compound specifically include the average value for cyanate groups per molecule for all of the cyanate resin present in 1 mol of the cyanate resin.

The cyanate ester compound is not particularly limited, as long as the cyanate ester compound is a cyanate ester compound for use as a raw material for various types of substrates which can be used for the production of laminates and circuit boards. Specific examples of the cyanate ester compound include 2,2-bis(4-cyanatophenyl)propane(bisphenol A cyanate compound), a novolac cyanate ester compound, a bisphenol M cyanate ester compound, bis(3,5-dimethyl-4-cyanatophenyl)methane, and 2,2-bis(4-cyanatophenyl)ethane. Further, examples of the cyanate ester compound also include derivatives of the respective cyanate ester compounds. Examples of the cyanate ester compound also include cyanate ester resins which are polymers of the respective cyanate esters. These may be used alone or in combination of two or more.

The content proportion of the reaction product is not particularly limited, but preferably 40% by mass to 80% by mass, inclusive, and more preferably 60% by mass to 80% by mass, inclusive, with respect to the total mass of the reaction product and the cyanate ester compound. The content proportion of the reaction product within the range mentioned above is preferable in terms of providing a cured product which is excellent in heat resistance while maintaining excellent dielectric characteristics.

The content proportion of the cyanate ester compound is not particularly limited, but preferably 20% by mass to 60% by mass, inclusive, and more preferably 20% by mass to 40% by mass, inclusive, with respect to the total mass of the reaction product and the cyanate ester compound. The content proportion of the cyanate ester compound within the range mentioned above allows for the preferred production of the insulating layer including a cured product which is excellent in heat resistance. Specifically, even in a case of the insulating layer including the fibrous substrate, it is possible to increase impregnation properties of the thermosetting resin composition with which the fibrous substrate is to be impregnated.

The curing catalyst is not particularly limited as long as the curing catalyst is a catalyst capable of accelerating the reaction between the reaction product and the cyanate ester compound as a curing agent. Examples of the curing catalyst include, specifically, organometallic salts of zinc, copper, iron, and the like with organic acids such as octanoic acid, stearic acid, acetylacetonate, naphthenic acid, and salicylic acid; tertiary amines such as triethylamine and triethanolamine; and imidazoles such as 2-ethyl-4-imidazole and 4-methylimidazole. Among these examples, the organometallic salts are preferred. Further, the curing catalysts may be used alone or in combination of two or more catalysts.

The content ratio of the curing catalyst is not particularly limited. For example, when an organometallic salt is used as the curing catalyst, the content ratio of the curing catalyst preferably ranges from 0.005 parts by mass to 5 parts by mass, inclusive, with respect to 100 parts by mass in total of the reaction product and the cyanate ester compound. On the other hand, when an imidazole is used as the curing catalyst, the content ratio of the curing catalyst preferably ranges from 0.01 parts by mass to 5 parts by mass, inclusive, with respect to 100 parts by mass in total of the reaction product and the cyanate ester compound.

The flame retardant is not particularly limited, but preferably a halogen-based flame retardant. Further, as the halogen-based flame retardant, a halogen-based flame retardant is preferred which is dispersed without compatibilization in the thermosetting resin composition. Examples of such a halogen-based flame retardant include a flame retardant that is not dissolved but dispersed in the thermosetting resin composition, and a flame retardant that is not dissolved but dispersed in a resin varnish obtained by adding, for example, a solvent to the thermosetting resin composition. It is to be noted that the phrase "dispersed without compatibilization" refers, in this case, to a state in which an object (the halogen-based flame retardant) is dispersed in the thermosetting resin composition while forming an island. For example, the phrase refers to a state in which an object (the halogen-based flame retardant) is finely dispersed at a molecular level in the thermosetting resin composition.

Use of a brominated epoxy compound in combination with a cyanate compound decreases the heat resistance, whereas use of no brominated epoxy compound has been found to significantly improve the heat resistance. Further, some findings have been gained that in a case of using a halogenated epoxy compound such as a brominated epoxy compound or using a general halogen-based flame retardant for a purpose of making the thermosetting resin composition flame-retardant, halogen is desorbed from the compound or the flame retardant at high temperature to generate a halogen ion (or halogen radical). And the desorbed halogen is considered to dissolve a cured product. Therefore, use of the halogen-based flame retardant described above can impart the flame retardancy without decreasing the heat resistance. More specifically, in a case of using such a flame retardant, the flame retardant in a particle state exists in a matrix to be less likely to decrease the glass transition temperature of a cured product and to be less likely to cause desorption of halogen, so that it is possible to suppress a decrease in heat resistance of the cured product obtained. For the reasons described above, the halogen-based flame retardant is capable of increasing the flame retardancy of the cured product while preventing the heat resistance of the cured product from being decreased.

The halogen-based flame retardant has a melting point of preferably 300° C. or higher, more preferably 320° C. or higher. Such a halogen-based flame retardant is capable of further suppressing a decrease in heat resistance of the cured product. Accordingly, the heat resistance of the insulating layer is further increased to give a metal-clad laminated board more excellent in heat resistance.

Examples of the halogen-based flame retardant specifically include ethylene dipentabromobenzene, ethylene bistetrabromoimide, decabromodiphenyloxide, tetradecabromodiphenoxybenzene, and bis(tribromophenoxy)ethane. Especially ethylene dipentabromobenzene, ethylene bistetrabromoimide, decabromocliphenyloxide, and tetradecabromodiphenoxybenzene that have a melting point of 300° C. or higher are preferable.

The halogen-based flame retardant dispersed in the insulating layer has an average particle size preferably from 0.1 μm to 50 μm, inclusive, more preferably from 1 μm to 10 μm, inclusive. The halogen-based flame retardant with such a particle size is dispersed to not only allow the heat resistance of the insulating layer to be maintained, but also allow the insulation between the layers. Furthermore, the flame retardancy is also sufficiently exhibited. It is to be noted that the average particle size can be measured with the use of, for example, a particle size distribution analyzer (SALD-2100 produced by SHIMADZU CORPORATION).

As regards a content proportion of the halogen-based flame retardant, it is preferable to contain the halogen-based flame retardant in such a proportion that gives a halogen concentration of 5% by mass to 30% by mass, inclusive, with respect to a mass of the thermosetting resin composition excluding any inorganic component.

Examples of the filler include, but not particularly limited thereto, a substance that is added to increase the heat resistance and the flame retardancy of the cured product of the curable composition and to increase dimensional stability during heating. More specifically, containing the filler is capable of increasing the heat resistance and the flame retardancy. And containing the filler is also capable of increasing the dimensional stability during heating. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. Especially, the filler is preferably silica, mica, or talc, more preferably spherical silica. These fillers may be used alone or in combination of two or more fillers. The filler may be either used as it is or as one surface-treated with, for example, an epoxysilane-type or aminosilane-type silane coupling agent. This silane coupling agent is preferably a vinylsilane-type, methacryloxysilane-type, acryloxysilane-type, or styrylsilane-type silane coupling agent from the viewpoint of reactivity with the radical polymerizable compound. Such a silane coupling agent increases adhesion strength with the metal foil and interlayer adhesion strength between resins. The silane coupling agent may be added to the filler by integral blending, instead a method that surface-treated has been conducted in advance.

When the thermosetting resin composition contains the filler, a content ratio of the filler ranges preferably from 10 parts by mass to 100 parts by mass, inclusive, more preferably from 20 parts by mass to 70 parts by mass, inclusive, further preferably from 20 parts by mass to 50 parts by mass, inclusive, with respect to 100 parts by mass in total of the reaction product and the cyanate ester compound.

The thermosetting resin composition used in the present exemplary embodiment may also contain an additive. Examples of the additive include antifoaming agents such as a silicone-based antifoaming agent and an acrylate-based antifoaming agent, an antioxidant, a thermostabilizer, an antistatic agent, an ultraviolet absorber, a dye and a pigment, a lubricant, and dispersants such as a wet dispersant.

The thermosetting resin composition used in the present exemplary embodiment may be used after prepared into a varnish. For example, when a prepreg is produced, the thermosetting resin composition may be used for preparing a varnish for a purpose of impregnating a substrate (fibrous substrate) with the thermosetting resin composition. That is, the thermosetting resin composition may be used as a varnish (resin varnish) into which the thermosetting resin composition has been prepared. In addition, in the thermosetting resin composition for use in the present exemplary embodiment, the reaction product and the cyanate ester compound are dissolved in the resin varnish. Such a varnish composition (resin varnish) is prepared as follows, for example.

First, components soluble in an organic solvent are added to and dissolved in an organic solvent. For example, the reaction product, and if necessary, the cyanate ester compound and the curing catalyst are respectively dissolved in predetermined amounts. In this regard, the solution may be heated as necessary. Subsequently, a component, such as the halogen-based flame retardant and the inorganic filler, that is used as necessary and is insoluble in an organic solvent is added and dispersed using, for example, a ball mill, a bead mill, a planetary mixer, or a roll mill until the solution becomes in a predetermined dispersion state, so as to prepare a varnish composition. The organic solvent for use herein is not particularly limited, as long as the organic solvent dissolves the reaction product, and does not inhibit the curing reaction. Specific examples of the organic solvent include toluene and methyl ethyl ketone (MEK).

The insulating layer may also include, as described above, not only the cured product of the thermosetting resin composition but also the fibrous substrate. This fibrous substrate is, for example, the same as a fibrous substrate included in a prepreg described later.

The use of the thermosetting resin composition according to the present exemplary embodiment is capable of giving not only the metal-clad laminated board, but also a prepreg, a resin-attached metal member (resin-attached metal foil), and a wiring board as described below. In this regard, the varnish composition mentioned above may be used as the thermosetting resin composition.

A prepreg according to another exemplary embodiment of the present disclosure includes a half-cured product of the thermosetting resin composition and a fibrous substrate. Examples of this prepreg include a prepreg in which the fibrous substrate presents in the half-cured product. More specifically, this prepreg includes the half-cured product and the fibrous substrate present in the half-cured product.

It is to be noted that the half-cured product refers to a product that is obtained by curing the thermosetting resin composition to such an extent that the composition can be further cured. More specifically, the half-cured product is a product that is obtained by half-curing the thermosetting resin composition (stage B). For example, when the thermosetting resin composition is heated, at first it gradually decreases in viscosity, subsequently starts to be cured, and it gradually increase in viscosity. In this case, the half-curing is, for example, a state between when the viscosity starts to increase and before the thermosetting resin composition is completely cured.

The prepreg according to the present exemplary embodiment includes the half-cured product of the thermosetting resin composition described above. That is, the prepreg includes the half-cured product of the thermosetting resin composition (thermosetting resin composition in the stage B) and the fibrous substrate.

A method for producing the prepreg according to the present exemplary embodiment is not particularly limited, as long as the method enables the production of the prepreg. Examples of the method include a method for impregnating the fibrous substrate with the thermosetting resin composition, which, for example, has been prepared into a varnish. More specifically, examples of the prepreg according to the present exemplary embodiment include a prepreg obtained by impregnating the fibrous substrate with the thermosetting resin composition. An impregnation method is not particularly limited as long as the method enables impregnation of the fibrous substrate with the thermosetting resin composition. Examples of the impregnation method include not only clipping but also methods using a roll, a die coater, or a bar coater, and spraying. In addition, as a method for producing the prepreg, the fibrous substrate impregnated with the thermosetting resin composition may be dried or heated after the impregnation. That is, examples of the method for producing the prepreg include a method for impregnating the fibrous substrate with the thermosetting resin composition that has been prepared into a varnish, followed by drying, a method for impregnating the fibrous substrate with the thermosetting resin composition that has been prepared into a varnish, followed by heating, and a method for impregnating the fibrous substrate with the thermosetting resin composition that has been prepared into a varnish, followed by drying and subsequent heating.

Specific examples of the fibrous substrate that is used to produce the prepreg include glass cloth, aramid cloth, polyester cloth, glass nonwoven fabric, aramid nonwoven fabric, polyester nonwoven fabric, pulp paper, and Linter paper. Use of glass cloth gives a laminate excellent in mechanical strength, and particularly, flattened glass cloth is preferable. Flattening can specifically be performed by, for example, pressing glass cloth continuously with a pressing roll at appropriate pressure to compress yarn in a flat shape. A fibrous substrate can be generally used that has a thickness ranging, for example, from 0.04 mm to 0.3 mm, inclusive.

The impregnation of the fibrous substrate with the curable composition is performed by, for example, immersion or application. This impregnation can be repeated a plurality of times as necessary. In this procedure, it is also possible to repeat the impregnation with use of a plurality of thermosetting resin compositions that are different in composition and concentration, for adjusting the composition and an amount of impregnation to finally desired composition and a finally desired amount of impregnation.

The fibrous substrate impregnated with the thermosetting resin composition is heated under a desired heating condition, for example, at 80° C. to 180° C. for 1 minute to 10 minutes to provide a prepreg in the half-cured state (stage B).

Such a prepreg allows for the production of a metal-clad laminated board and a wiring board which have excellent dielectric characteristics and heat resistance.

The method for producing the metal-clad laminated board according to the present exemplary embodiment is not particularly limited, as long as the method can produce the metal-clad laminated board. As the method for producing the metal-clad laminated board, for example, first, at least a part of the polyphenylene ether is reacted with epoxy groups of the epoxy compound such that the terminal hydroxyl group concentration is 700 μmol/g or less. It is to be noted that the reaction herein refers to the preliminary reaction described above. The thermosetting resin composition containing the reaction product is obtained by such a preliminary reaction. In this step, the composition may contain components other than the reaction product. Thereafter, the metal-clad laminated board can be obtained in the same way as a method for producing a common metal-clad laminated board, except for the use of the thermosetting resin composition. Examples of the method include a method of using the prepreg with the use of the thermosetting resin composition. Examples of the method for preparing the metal-clad laminated board with the use of a prepreg include a method of laminating one or more prepregs, and further laminating, on one or both of the upper and lower surfaces, a metal foil such as a copper foil, followed by heat pressure molding for lamination and integration. This method enables the preparation of a both-surface or one-surface metal foil-clad laminate. More specifically, the metal-clad laminated board according to the present exemplary embodiment is obtained by laminating a metal foil on the prepreg described above, followed by heat pressure molding. Heat pressure conditions can be appropriately set according to, for example, thickness of a laminate to be produced and a type of the curable composition of the prepreg. For example, the conditions can be set to a temperature ranging from 170° C. to 210° C., a pressure ranging from 3.5 MPa to 4 MPa, and a time ranging from 60 minutes to 150 minutes. Alternatively, the metal-clad laminated board may be produced without using the prepreg. Examples of a method without using the prepreg include a method for applying onto a metal foil the curable composition such as a varnish curable composition and forming on the metal foil a layer including the curable composition, followed by heat pressing. More specifically, as the method for producing the metal-clad laminated board, for example, first, at least a part of the polyphenylene ether is reacted with epoxy groups of the epoxy compound such that the terminal hydroxyl group concentration is 700 μmol/g or less. It is to be noted that the reaction herein refers to the preliminary reaction described above. The thermosetting resin composition containing the reaction product is obtained by such a preliminary reaction. In this step, the composition may contain components other than the reaction product. Thereafter, the metal-clad laminated board can be obtained in the same way as a method for producing a common metal-clad laminated board, except for the use of the thermosetting resin composition. More specifically, the method for producing the metal-clad laminated board includes a step of obtaining the thermosetting resin composition, a step of obtaining a prepreg by impregnating a fibrous substrate with the thermosetting resin composition, and a step of obtaining a metal-clad laminated board including an insulating layer including a cured product of the thermosetting resin composition, and a metal layer in contact with at least one surface of the insulating layer, by laminating the metal layer on the prepreg, followed by heat pressure molding. Further, the metal layer includes, as described above, a metal substrate and a barrier layer containing cobalt provided on the metal substrate at a side close to a contact surface of the metal layer with the insulating layer, and the contact surface has surface roughness of 2 μm or less in ten-point average roughness Rz. According to this production method, the metal-clad laminated board can be produced.

Figure 2:
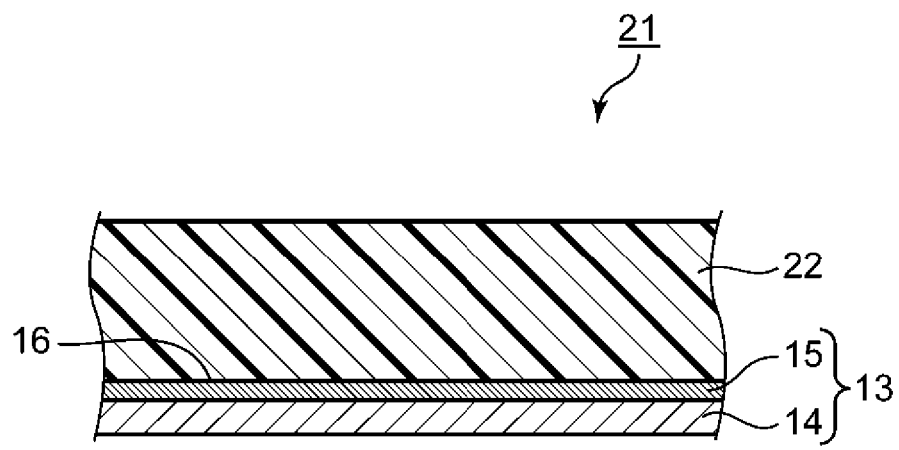
FIG. 2 is a cross-sectional view illustrating a configuration of a resin-attached metal member according to another exemplary embodiment of the present disclosure.

Further, a resin-attached metal member (resin-attached metal foil) according to another exemplary embodiment of the present disclosure includes an insulating layer and a metal layer in contact with one surface of the insulating layer. This resin-attached metal member (resin-attached metal foil) 21 includes, as illustrated in FIG. 2, insulating layer 22 and metal layer 13 disposed in contact with one surface of the insulating layer. FIG. 2 is a cross-sectional view illustrating a configuration of resin-attached metal member 21 according to the present exemplary embodiment.

The insulating layer 22 is adapted to include the half-cured product of the thermosetting resin composition mentioned above, and adapted to include the half-cured product of the thermosetting resin composition (thermosetting resin composition in the stage B) and the metal layer. Further, the insulating layer necessarily includes the half-cured product of the thermosetting resin composition, and may include or does not necessarily include the fibrous substrate. As the fibrous substrate, it is possible to use one the same as the fibrous substrate of the prepreg.

Metal layer 13 is the same as metal layer included in the metal-clad laminated board. Specifically, metal layer 13 includes metal substrate 14, and barrier layer 15 provided on metal substrate 14 at a side close to contact surface 16 of metal layer 13 with insulating layer 12. Metal layer 13 includes, as illustrated in FIG. 2, metal substrate 14 and barrier layer 15 provided on metal substrate 14 at a side close to contact surface 16 of metal layer 13 with insulating layer 12. Alternatively, the metal layer may include the barrier layer on both surfaces of the metal substrate. In addition, contact surface 16 has surface roughness of 2 μm or less in ten-point average roughness Rz.

Such a resin-attached metal member is a resin-attached metal member which allows for the preferred production of a wiring board which has a reduced loss during signal transmission. Further, this resin-attached metal member is adapted to not only allow the preferred production of a wiring board which has a reduced loss during signal transmission, but also exhibit excellent heat resistance.

The method for producing the resin-attached metal member according to the present exemplary embodiment is not particularly limited, as long as the method allows the production of the resin-attached metal member. As the method for producing the resin-attached metal member, first, at least a part of the polyphenylene ether is reacted with epoxy groups of the epoxy compound such that the terminal hydroxyl group concentration is 700 μmol/g or less, as with the method for producing the metal-clad laminated board. It is to be noted that the reaction herein refers to the preliminary reaction described above. The thermosetting resin composition containing the reaction product is obtained by such a preliminary reaction. In this step, the composition may contain components other than the reaction product. Thereafter, the metal-clad laminated board can be obtained in the same way as a method for producing a common resin-attached metal member, except for the use of the thermosetting resin composition. Examples of the method include a method for applying, onto the metal layer, the thermosetting resin composition, for example, the thermosetting resin composition that has been prepared into a varnish. More specifically, examples of the resin-attached metal member according to the exemplary embodiment of the present disclosure include a resin-attached metal member obtained by applying the thermosetting resin composition onto the metal layer. The application method is not particularly limited, as long as the method can apply the thermosetting resin composition to the metal layer. Examples of the application method include methods that use a roll, a die coater, and a bar coater, and spraying. Further, as a method for producing resin-attached metal member, the metal layer onto which the thermosetting resin composition has been applied may be dried or heated after the application. More specifically, examples of the method for producing the resin-attached metal member include a method for applying onto the metal layer the thermosetting resin composition that has been prepared into a varnish, followed by drying, a method for applying onto the metal layer the thermosetting resin composition that has been prepared into a varnish, followed by heating, and a method for applying onto the metal layer the thermosetting resin composition that has been prepared into a varnish, followed by drying and subsequent heating.

It is to be noted that the metal layer onto which the thermosetting resin composition has been applied is heated under a desired heating condition, for example, at 80° C. to 180° C. for 1 minute to 10 minutes, thereby providing the resin-attached metal member in the half-cured state (stage B).

Such a resin-attached metal member (resin-attached metal foil) allows the production of the metal-clad laminated board and a wiring board which have excellent dielectric characteristics and heat resistance. More specifically, the resin-attached metal member allows for the preferred production of a wiring board which has a reduced loss during signal transmission.

Figure 3:
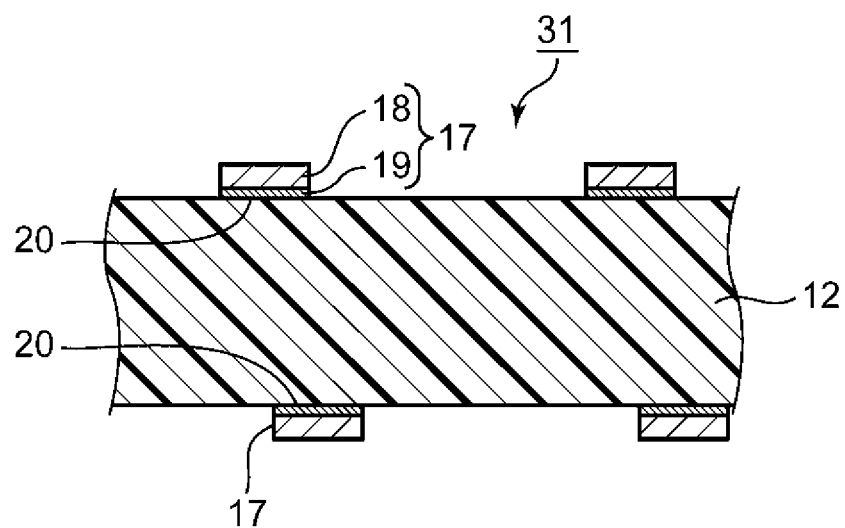
FIG. 3 is a cross-sectional view illustrating a configuration of a wiring board according to another exemplary embodiment of the present disclosure.

A wiring board according to another exemplary embodiment of the present disclosure includes an insulating layer and a wiring in contact with at least one surface of the insulating layer. More specifically, this wiring board includes the wiring on the surface of the insulating layer. This wiring board 31 includes, as illustrated in FIG. 3, insulating layer 12 and wiring 17 disposed in contact with both surfaces of the insulating layer. Alternatively, the wiring board may include wiring only on and in contact with one surface of the insulating layer. FIG. 3 is a cross-sectional view illustrating a configuration of wiring board 31 according to the present exemplary embodiment.

Wiring 17 includes, as with the metal layer of the metal-clad laminated board, metal substrate 18 and barrier layer 19 provided on metal substrate 18 at a side close to contact surface 20 of wiring 17 with insulating layer 12. Examples of wiring 17 include a wiring including, as illustrated in FIG. 3, metal substrate 18, and barrier layer 19 provided on metal substrate 18 at the side close to contact surface 20 of wiring 17 with insulating layer 12. Alternatively, the wiring may include the barrier layer on both surfaces of the metal substrate. In addition, contact surface 20 has surface roughness of 2 μm or less in ten-point average roughness Rz.

Examples of insulating layer 12 include the same layer as the insulating layer of the metal-clad laminated board.

Examples of wiring 17 include a wiring formed by partially removing the metal layer of the metal-clad laminated board. Examples of such a wiring include wiring formed by a method such as a subtractive method, an additive method, a semi-additive method, chemical mechanical polishing (CMP), trenching, ink-jet printing, squeegee, or transferring.

Such a wiring board is a wiring board which has a reduced loss during signal transmission. Further, this wiring board is adapted to not only reduce the loss during signal transmission, but also exhibit excellent heat resistance.

The method for producing the wiring board according to the present exemplary embodiment is not particularly limited, as long as the method can produce the wiring board with the use of the metal-clad laminated board or the resin-attached metal member. Examples of the method for producing the wiring board include a method that uses a common metal-clad laminated board. Examples of the method for preparing the wiring board with the use of the metal-clad laminated board include a method for forming a circuit by etching the metal layer on the surface of the metal-clad laminated board. This method can provide a wiring board that has a conductor pattern provided as a circuit on the surface of metal-clad laminated board. More specifically, the wiring board according to the present exemplary embodiment is obtained by partially removing the metal layer on the surface of the metal-clad laminated board for the formation of a circuit. The method for producing the wiring board includes, for example, a step of obtaining a thermosetting resin composition containing a reaction product obtained by reacting at least a part of the polyphenylene ether with epoxy groups of the epoxy compound such that the terminal hydroxyl group concentration is 700 μmol/g or less. Furthermore, the method includes a step of obtaining a prepreg by impregnating a fibrous substrate with the thermosetting resin composition, a step of obtaining a metal-clad laminated board including an insulating layer including a cured product of the thermosetting resin composition, and a metal layer in contact with at least one surface of the insulating layer, by laminating the metal layer on the prepreg, followed by heat pressure molding, and a step of forming a wiring in contact with at least one surface of the insulating layer by partially removing the metal layer of the metal-clad laminated board. Further, examples of the method include the production method where the metal layer includes a metal substrate and a barrier layer containing cobalt provided on the metal substrate at a side close to a contact surface of the metal layer with the insulating layer, and the contact surface has surface roughness of 2 μm or less in ten-point average roughness Rz.

This method can produce a wiring board which has a reduced loss during signal transmission.

Hereinafter, the present disclosure is described more specifically by way of examples. A scope of the present disclosure, however, is not limited to these examples.

EXAMPLES

[Preparation of Reaction Product]
Components that are used to prepare a reaction product in the present example are described.
(Polyphenylene Ether: PPE)
PPE-1: SA90 produced by SABIC Innovative Plastics (weight-average molecular weight Mw: 1500, average number of hydroxyl groups: 1.9, terminal hydroxyl group concentration: 1270 μmol/g, X in the structural formula of the formula (1): —C(CH$_3$)$_2$—)
PPE-2: SA120 produced by SABIC Innovative Plastics (weight-average molecular weight Mw: 2500, average number of hydroxyl groups: 1, terminal hydroxyl group concentration: 400 μmol/g, X in the structural formula of the formula (1): —C(CH$_3$)$_2$—)

(Epoxy Compound)
Epoxy compound 1: dicyclopentadiene epoxy compound (EPICLON HP7200 produced by DIC Corporation, number-average molecular weight Mn: 550, average number of epoxy groups: 2.3)
Epoxy compound 2: dicyclopentadiene epoxy compound (EPICLON HP7200H produced by DIC Corporation, number-average molecular weight Mn: 650, average number of epoxy groups: 2.5)
Epoxy compound 3: bisphenol A epoxy compound (EPICLON 850S produced by DIC Corporation, number-average molecular weight Mn: 350, average number of epoxy groups: 2)
Epoxy compound 4: alkylphenol glycidyl ether (EPICLON 520 produced by DIC Corporation, number-average molecular weight Mn: 210, average number of epoxy groups: 1)
(Catalyst for Pre-Reaction)
2E4MZ: 2-ethyl-4-imidazole (produced by SHIKOKU CHEMICALS CORPORATION)
[Preparation Method]
The respective components were added to toluene to meet the blending proportions listed in Tables 1 and 2, and then stirred at 100° C. for 2 to 10 hours. In such a way, the reaction product was prepared by reacting in advance (preliminary reaction: pre-reaction) the polyphenylene ether with the epoxy compound. The reaction product was prepared such that the solid content concentrations of reaction products obtained were each 60%.
[Result of Pre-Reaction (Reaction)]
The preliminary reaction was evaluated visually to determine whether gelation was observed or not. As a result, the reaction was evaluated as "OK" if there is no confirmable gelation, whereas the reaction was evaluated as "NG" if there is any confirmable gelation. It is to be noted that the mark "-" is shown when there was no pre-reaction developed.
[Terminal Hydroxyl Group Concentration of Reaction Product: Terminal Hydroxyl Group Concentration After Preliminary Reaction]
Then, the terminal hydroxyl group concentration of the reaction product was measured in the following way.
Specifically, the absorbance of the solution in which the polyphenylene ether and the epoxy compound were mixed was measured before the development of the preliminary reaction. Specifically, the absorbance of the solution before the development of the preliminary reaction was measured by measurement at a measurement wavelength of 318 nm with the use of an ultraviolet absorptiometer (UVmini-1240 produced by Shimadzu Corporation), with the addition of an ethanol solution of 10% tetraethylammonium hydroxide to the solution before the development of the preliminary reaction in methylene chloride. Next, the absorbance of the solution after the development of the preliminary reaction was measured by the same method. Then, the terminal hydroxyl group concentration was calculated from the respective absorbances obtained and the blending amount of the polyphenylene ether.
Tables 1 and 2 show the above results.

Example 1

[Preparation of Thermosetting Resin Composition]
Respective components will be described for use in the preparation of a thermosetting resin composition in the present example.

(Cyanate Ester Compound)
Cyanate ester compound: 2,2-bis(4-cyanatophenyl)propane (BADCy produced by Lonza Japan Ltd.)
(Curing Catalyst: Organometallic Salt)
Zinc octanoate (produced by DIC Corporation, zinc concentration: 18% by mass)
(Flame Retardant: Halogen-Based Flame Retardant)
SAYTEX 8010: ethylene bis(pentabromophenyl) (SAYTEX 8010 produced by ALBEMARLE JAPAN CORPORATION, melting point: 350° C., halogen-based flame retardant incompatible and dispersed in thermosetting resin composition)
(Filler: Inorganic Filler)
Inorganic filler (SC-2500-SEJ produced by Admatechs Company Limited, silica treated with epoxysilane-type silane coupling agent)

[Preparation Method]

First, so as to provide the composition (blending proportions) listed in Tables 1 and 2, a solution of the reaction product obtained was heated to 60° C., and the cyanate ester compound and if necessary, the epoxy compound were added to and mixed with the solution. The mixture was stirred for 30 minutes at 60° C. kept, for complete dissolution. Subsequently, the other components were added to the solution to provide the compositions (blending proportions) listed in Tables 1 and 2, and dispersed with a ball mill. The foregoing way provided a varnish-like thermosetting resin composition (varnish).

Next, the varnish obtained was impregnated into a fibrous substrate, i.e., glass cloth (#2116 type, WEA116E produced by NITTO BOSEKI CO., LTD., E glass, thickness: 0.1 mm) made of E glass and then heated and dried at 150° C. for about 3 minutes to 5 minutes to give a prepreg.

Then, six prepregs obtained were laminated on one another, and on both sides of the laminated, a copper foil that has been plated with cobalt (T9FZ-SV produced by Fukuda Metal Foil & Powder Co., Ltd. [copper foil with cobalt barrier layer, Rz: 1.6 μm, thickness: 18 μm], indicated as metal layer 1 in Table 1) was disposed as a metal layer in such a manner as to bring the layer formed by cobalt plating (cobalt barrier layer) into contact with the prepreg. Thus, an object to be pressed was prepared, and the object was heated and pressed under a condition at a temperature of 220° C. and a pressure of 3 MPa, thereby providing a metal-clad laminated board of about 0.75 mm in thickness, with a metal layer bonded to both surfaces.

Examples 2 to 9 and Comparative Examples 1 to 7

Examples 2 to 9 and Comparative Examples 1 to 7 are each the same as Example 1 except for changing the composition of the thermosetting resin composition, the metal layer, and the fibrous substrate to those indicated in Tables 1 and 2.

As glass cloth made of NE glass, used was #2116 type produced by NITTO BOSEKI CO., LTD. (NEA 116, NE glass, thickness: 0.1 mm).

As metal layer 2, used was a copper foil plated with cobalt (copper foil with a cobalt barrier layer, T9DA-SV produced by Fukuda Metal Foil & Powder Co., Ltd. [Rz: 1.0 μm, thickness: 18 μm].

As metal layer 3, used was a copper foil plated with cobalt (copper foil with a cobalt barrier layer, T9FZ-HS produced by Fukuda Metal Foil & Powder Co., Ltd. [Rz: 6.0 μm, thickness: 18 μm].

As metal layer 4, used was a copper foil plated with nickel (copper foil with a nickel layer, T4X-SV produced by Fukuda Metal Foil & Powder Co., Ltd. [Rz: 1.1 μm, thickness: 18 μm].

Example 10

According to Example 10, provided is a resin-attached metal member (resin-attached metal foil), including no fibrous substrate in insulating layer. Specifically, the resin-attached metal member was produced in the same manner as in Example 1, except for the insulating layer including no fibrous substrate, and for the use of the composition of the thermosetting resin composition and metal layer as shown in Table 2.

The respective metal-clad laminated boards or resin-attached metal foil prepared as mentioned above were evaluated by the following methods. The methods for evaluating the resin-attached metal foil were implemented in accordance with the same methods, except that the resin-attached metal foil was used in place of the metal-clad laminated board. It is to be noted that the mark "-" is shown in the respective evaluations, when no evaluation was possible due to gelation in the preparation of the reaction product.

[Dielectric Characteristics (Relative Dielectric Constant and Dielectric Dissipation Factor)]

A relative dielectric constant and a dielectric dissipation factor of the metal-clad laminated board at 10 GHz were measured by the method in accordance with IPC-TM650-2.5.5.9. Specifically, the relative dielectric constant and dielectric dissipation factor of the metal-clad laminated board at 10 GHz were measured with the use of an impedance analyzer (RF impedance analyzer HP4291B produced by Agilent Technologies).

[Transmission Loss]

One metal layer of the metal-clad laminated board was etched to form a straight-line wiring of 100 μm to 200 μm in width and 1000 mm in length. A 15 GHz signal was applied to this wiring, and a transmission loss (dB/m) was measured.

[Glass Transition Temperature (Tg)]

First, Tg of an unclad laminate obtained by etching and thus removing the metal layers on both surfaces of the metal-clad laminated board was measured. Specifically, the Tg of the unclad laminate was measured using dynamic mechanical spectrometer "DMS100" produced by Seiko Instruments Inc. In the measurement, dynamic mechanical analysis (DMA) was carried out at a frequency of 10 Hz with a bending module, and the Tg (° C.) was defined as a temperature at which tan δ showed a local maximal value when the temperature was raised from room temperature up to 280° C. under a condition with a temperature raising speed of 5° C./minute.

[Oven Heat Resistance]

In accordance with the standard of JIS C 6481, the metal-clad laminated board was left to stand still for 1 hour in a thermostatic chamber set at 270° C., and then taken out. Then, the metal-clad laminated board taken out was observed visually. Metal-clad laminated board 11 that was confirmed to have generated no bulge was evaluated as "OK" and metal-clad laminated board 11 that was confirmed to have generated a bulge was evaluated as "NG."

[Interlayer Adhesion: Interlayer Bonding Strength]

The interlayer bonding strength (N/mm) between the metal layer and the insulating layer was measured in accordance with the standard of JIS C6481.

Tables 1 and 2 show results of the respective evaluations mentioned above.

TABLE 1

|  |  |  | Example | | | | |
|---|---|---|---|---|---|---|---|
|  |  |  | 1 | 2 | 3 | 4 | 5 |
| Composition of Reaction Product (parts by mass) | PPE-1 (Average Number of Hydroxyl Groups: 1.9) | | 30 | 30 | 30 | 30 | 30 |
|  | PPE-2 (Average Number of Hydroxyl Groups: 1) | | — | — | — | — | — |
|  | Epoxy Compound 1 (Average Number of Epoxy Groups: 2.3) | | 40 | 40 | 40 | 40 | 40 |
|  | Epoxy Compound 2 (Average Number of Epoxy Groups: 2.5) | | — | — | — | — | — |
|  | Epoxy Compound 4 (Average Number of Epoxy Groups: 1) | | — | — | — | — | — |
|  | 2E4MZ | | 0.07 | 0.07 | 0.07 | 0.07 | 0.07 |
|  | Result of Pre-reaction | | OK | OK | OK | OK | OK |
|  | Terminal Hydroxyl Group Concentration (μmol/g) | | 10 | 100 | 400 | 700 | 10 |
| Composition (parts by mass) | PPE-1 (Average Number of Hydroxyl Groups: 1.9) | | — | — | — | — | — |
|  | Epoxy Compound 1 (Average Number of Epoxy Groups: 2.3) | | — | — | — | — | — |
|  | Cyanate Ester Compound | | 30 | 30 | 30 | 30 | 30 |
|  | Organometallic Salt | Zinc Octanoate | 0.005 | 0.005 | 0.005 | 0.005 | 0.005 |
|  | Inorganic Filler | Inorganic Filler | 50 | 50 | 50 | 50 | 50 |
|  | Halogen-based Flame Retardant | SAYTEX8010 | 25 | 25 | 25 | 25 | 25 |
| Fibrous Substrate | E glass | | OK | OK | OK | OK | OK |
| Metal Layer | Metal Layer 1 | Cobalt Rz: 1.6 μm | OK | OK | OK | OK | — |
|  | Metal Layer 2 | Cobalt Rz: 1.0 μm | — | — | — | — | OK |
|  | Metal Layer 3 | Cobalt Rz: 6.0 μm | — | — | — | — | — |
|  | Metal Layer 4 | Nickel Rz: 1.1 μm | — | — | — | — | — |
| Evaluation | Relative Dielectric Constant | | 3.7 | 3.7 | 3.7 | 3.7 | 3.7 |
|  | Dielectric Dissipation Factor | | 0.009 | 0.009 | 0.009 | 0.009 | 0.009 |
|  | Transmission Loss (dB/m) | | −35 | −35 | −35 | −35 | −34 |
|  | Glass Transition Temperature Tg (° C.) | | 215 | 215 | 215 | 215 | 215 |
|  | Oven Heat Resistance | | OK | OK | OK | OK | OK |
|  | Interlayer Bonding Strength (N/nm) | | 1.1 | 1.0 | 0.9 | 0.9 | 1.1 |

|  |  |  | Comparative Example | | | | | | |
|---|---|---|---|---|---|---|---|---|---|
|  |  |  | 1 | 2 | 3 | 4 | 5 | 6 | 7 |
| Composition of Reaction Product (parts by mass) | PPE-1 (Average Number of Hydroxyl Groups: 1.9) | | 30 | — | 30 | 30 | 30 | — | 30 |
|  | PPE-2 (Average Number of Hydroxyl Groups: 1) | | — | 30 | — | — | — | — | — |
|  | Epoxy Compound 1 (Average Number of Epoxy Groups: 2.3) | | 40 | 40 | — | — | 40 | — | 40 |
|  | Epoxy Compound 2 (Average Number of Epoxy Groups: 2.5) | | — | — | 40 | — | — | — | — |
|  | Epoxy Compound 4 (Average Number of Epoxy Groups: 1) | | — | — | — | 40 | — | — | — |
|  | 2E4MZ | | 0.07 | 0.07 | 0.07 | 0.07 | 0.07 | — | 0.07 |
|  | Result of Pre-reaction | | OK | OK | NG | OK | OK | — | OK |
|  | Terminal Hydroxyl Group Concentration (μmol/g) | | 800 | 300 | — | 100 | 10 | — | 10 |
| Composition (parts by mass) | PPE-1 (Average Number of Hydroxyl Groups: 1.9) | | — | — | — | — | — | 30 | — |
|  | Epoxy Compound 1 (Average Number of Epoxy Groups: 2.3) | | — | — | — | — | — | 40 | — |
|  | Cyanate Ester Compound | | 30 | 30 | — | 30 | 30 | 30 | 30 |
|  | Organometallic Salt | Zinc Octanoate | 0.005 | 0.005 | — | 0.005 | 0.005 | 0.005 | 0.005 |
|  | Inorganic Filler | Inorganic Filler | 50 | 50 | 50 | 50 | 50 | 50 | 50 |
|  | Halogen-based Flame Retardant | SAYTEX8010 | 25 | 25 | — | 25 | 25 | 25 | 25 |
| Fibrous Substrate | E glass | | OK | OK | OK | OK | OK | OK | OK |
| Metal Layer | Metal Layer 1 | Cobalt Rz: 1.6 μm | OK | OK | OK | OK | — | OK | — |
|  | Metal Layer 2 | Cobalt Rz: 1.0 μm | — | — | — | — | — | — | — |
|  | Metal Layer 3 | Cobalt Rz: 6.0 μm | — | — | — | — | — | — | OK |
|  | Metal Layer 4 | Nickel Rz: 1.1 μm | — | — | — | — | OK | — | — |
| Evaluation | Relative Dielectric Constant | | 3.7 | 3.7 | — | 3.7 | 3.7 | 3.7 | 3.7 |
|  | Dielectric Dissipation Factor | | 0.009 | 0.009 | — | 0.009 | 0.009 | 0.009 | 0.009 |
|  | Transmission Loss (dB/m) | | −35 | −35 | — | −35 | −43 | −35 | −43 |
|  | Glass Transition Temperature Tg (° C.) | | 215 | 220 | — | 195 | 215 | 170 | 215 |
|  | Oven Heat Resistance | | OK | NG | — | NG | OK | NG | OK |
|  | Interlayer Bonding Strength (N/nm) | | 0.7 | 0.5 | — | 0.8 | 1.1 | 0.6 | 1.1 |

TABLE 2

|  |  | Example | | | | | |
| --- | --- | --- | --- | --- | --- | --- | --- |
|  |  | 1 | 6 | 7 | 8 | 9 | 10 |
| Composition of Reaction Product (parts by mass) | PPE-1 (Average Number of Hydroxyl Groups: 1.9) | 30 | 30 | 10 | 10 | 30 | 30 |
|  | Epoxy Compound 1 (Average Number of Epoxy Groups: 2.3) | 40 | — | 15 | 15 | 40 | 40 |
|  | Epoxy Compound 2 (Average Number of Epoxy Groups: 2.5) | — | — | — | — | — | — |
|  | Epoxy Compound 3 (Average Number of Epoxy Groups: 2) | — | 40 | — | — | — | — |
|  | Epoxy Compound 4 (Average Number of Epoxy Groups: 1) | — | — | — | — | — | — |
|  | 2E4MZ | 0.07 | 0.07 | 0.025 | 0.025 | 0.07 | 0.07 |
|  | Result of Pre-reaction | OK | OK | OK | OK | OK | OK |
|  | Terminal Hydroxyl Group Concentration (μmol/g) | 10 | 10 | 10 | 10 | 10 | 10 |
| Composition (parts by mass) | PPE-1 (Average Number of Hydroxyl Groups: 1.9) | — | — | 10 | 10 | — | — |
|  | Epoxy Compound 1 (Average Number of Epoxy Groups: 2.3) | — | — | 35 | — | — | — |
|  | Epoxy Compound 2 (Average Number of Epoxy Groups: 2.5) | — | — | — | 35 | — | — |
|  | Cyanate Ester Compound | 30 | 30 | 30 | 30 | 30 | 30 |
|  | Organometallic Salt — Zinc Octanoate | 0.005 | 0.005 | 0.005 | 0.005 | 0.005 | 0.005 |
|  | Inorganic Filler — Inorganic Filler | 50 | 50 | 50 | 50 | 50 | 50 |
|  | Halogen-based Flame Retardant — SAYTEX8010 | 25 | 25 | 25 | 25 | 25 | 25 |
| Fibrous Substrate | E glass | OK | OK | OK | OK | — | — |
|  | NE glass | — | — | — | — | OK | — |
| Metal Layer | Metal Layer 1 — Cobalt Rz: 1.6 μm | OK | OK | OK | OK | OK | OK |
| Evaluation | Relative Dielectric Constant | 3.7 | 3.8 | 3.7 | 3.7 | 3.3 | 3.0 |
|  | Dielectric Dissipation Factor | 0.009 | 0.01 | 0.009 | 0.009 | 0.007 | 0.006 |
|  | Transmission Loss (dB/m) | −35 | −37 | −35 | −35 | −31 | −29 |
|  | Glass Transition Temperature Tg (° C.) | 215 | 200 | 205 | 210 | 215 | 215 |
|  | Oven Heat Resistance | OK | OK | OK | OK | OK | OK |
|  | Interlayer Bonding Strength (N/nm) | 1.1 | 1.1 | 0.9 | 0.9 | 1.1 | — |

|  |  | Comparative Example | | | |
| --- | --- | --- | --- | --- | --- |
|  |  | 1 | 3 | 4 | 6 |
| Composition of Reaction Product (parts by mass) | PPE-1 (Average Number of Hydroxyl Groups: 1.9) | 30 | 30 | 30 | — |
|  | Epoxy Compound 1 (Average Number of Epoxy Groups: 2.3) | 40 | — | — | — |
|  | Epoxy Compound 2 (Average Number of Epoxy Groups: 2.5) | — | 40 | — | — |
|  | Epoxy Compound 3 (Average Number of Epoxy Groups: 2) | — | — | — | — |
|  | Epoxy Compound 4 (Average Number of Epoxy Groups: 1) | — | — | 40 | — |
|  | 2E4MZ | 0.07 | 0.07 | 0.07 | — |
|  | Result of Pre-reaction | OK | NG | OK | — |
|  | Terminal Hydroxyl Group Concentration (μmol/g) | 800 | — | 100 | — |
| Composition (parts by mass) | PPE-1 (Average Number of Hydroxyl Groups: 1.9) | — | — | — | 30 |
|  | Epoxy Compound 1 (Average Number of Epoxy Groups: 2.3) | — | — | — | 40 |
|  | Epoxy Compound 2 (Average Number of Epoxy Groups: 2.5) | — | — | — | — |
|  | Cyanate Ester Compound | 30 | — | 30 | 30 |
|  | Organometallic Salt — Zinc Octanoate | 0.005 | — | 0.005 | 0.005 |
|  | Inorganic Filler — Inorganic Filler | 50 | 50 | 50 | 50 |
|  | Halogen-based Flame Retardant — SAYTEX8010 | 25 | — | 25 | 25 |
| Fibrous Substrate | E glass | OK | OK | OK | OK |
|  | NE glass | — | — | — | — |
| Metal Layer | Metal Layer 1 — Cobalt Rz: 1.6 μm | OK | OK | OK | OK |
| Evaluation | Relative Dielectric Constant | 3.7 | — | 3.7 | 3.7 |
|  | Dielectric Dissipation Factor | 0.009 | — | 0.009 | 0.009 |
|  | Transmission Loss (dB/m) | −35 | — | −35 | −35 |
|  | Glass Transition Temperature Tg (° C.) | 215 | — | 195 | 170 |
|  | Oven Heat Resistance | OK | — | NG | NG |
|  | Interlayer Bonding Strength (N/nm) | 0.7 | — | 0.8 | 0.6 |

As is understood from Tables 1 and 2, the metal-clad laminated boards according to Examples 1 to 9 and the resin-attached metal member according to Example 10 have been determined to allow for the preferred production of wiring boards which have excellent dielectric characteristics, and have a reduced loss during signal transmission. Further, the metal-clad laminated boards according to Examples 1 to 9 and the resin-attached metal member according to Example 10 have been found to not only reduce the loss during signal transmission, but also have excellent heat resistance. Further, the metal-clad laminated boards according to Examples 1 to 9 and the resin-attached metal member according to Example 10 have been each determined to have high bonding strength between the metal layer and the insulating layer.

Further, the metal-clad laminated boards according to Examples 1 to 9 and the resin-attached metal member according to Example 10 have been each determined to include the insulating layer including a cured product of the thermosetting resin composition containing the reaction product between the polyphenylene ether with the average number of hydroxyl groups from 1.5 to 2 and the epoxy compound with the average number of epoxy groups from 2 to 2.3, where the reaction product has a terminal hydroxyl group concentration of 700 μmol/g or less, and the metal layer satisfies the following condition. The metal layer includes a cobalt barrier layer, and the layer has surface roughness of 2 μm or less in ten-point average roughness Rz. Further, the metal-clad laminated boards according to Examples 1 to 9 and resin-attached metal member according to Example 10 each have this barrier layer disposed to make contact with insulating layer.

In contrast, the bonding strength between the metal layer and the insulating layer was low in the case of the terminal hydroxyl group concentration of the reaction product in excess of 700 μmol/g (Comparative Example 1). Due to the foregoing, the wiring was likely to be peeled in the case of providing a wiring board. Further, in the production of the reaction product, in the case of using the epoxy compound with the average number of epoxy groups less than 2 (Comparative Examples 2 and 4), and in the case of developing no preliminary reaction (Comparative Example 7), the heat resistance of the insulating layer was low, and the bonding strength between the metal layer and the insulating layer was low. From the foregoing, Comparative Examples 1, 2, 4, and 7, which are likely to have wirings peeled in the case of providing wiring boards, have been determined to fail to serve as metal-clad laminated boards which allow for preferred production of wiring boards which have a reduced loss during signal transmission.

In the preparation of the reaction product, in the case of using the epoxy compound with the average number of epoxy groups in excess of 2.3 (Comparative Example 3), the reaction product turned into a gel, thereby failing to production any preferred metal-clad laminated board.

When the metal layer was used that included as the barrier layer the layer made of nickel (Comparative Example 5) and when the metal layer with Rz of more than 2 μm was used (Comparative Example 7), the loss during signal transmission was larger than the losses in the examples. From the foregoing, Comparative Examples 5 and 7 have been determined to fail to serve as metal-clad laminated boards which allow for preferred production of wiring boards which have a reduced loss during signal transmission.

The present disclosure is useful, because the disclosure can provide metal-clad laminated boards, resin-attached metal members, and wiring boards which have excellent performance.

The invention claimed is:
1. A metal-clad laminated board comprising:
an insulating layer; and
a metal layer in contact with at least one surface of the insulating layer, wherein:
the insulating layer includes a cured product of a thermosetting resin composition containing a reaction product of a polyphenylene ether and an epoxy compound, the polyphenylene ether having 1.5 to 2 hydroxyl groups on average in one molecule, the epoxy compound having 2 to 2.3 epoxy groups on average in one molecule,
the reaction product has a terminal hydroxyl group concentration of 700 μmol/g or less,
the metal layer includes a metal substrate and a barrier layer containing cobalt, the barrier layer being provided on the metal substrate at a side close to a contact surface of the metal layer with the insulating layer,
the contact surface has surface roughness of 2 μm or less in ten-point average roughness Rz,
the barrier layer does not contain nickel, and
a transmission loss of the metal-clad laminated board is equal to or more than −37 dB/m, where the transmission loss is measured by applying a 15 GHz signal to a straight-line wiring that is formed from the metal layer of the metal-clad laminated board, the straight-line wiring having a length of 1000 mm and a width ranging from 100 μm to 200 μm.

2. The metal-clad laminated board according to claim 1, wherein the polyphenylene ether is a compound represented by a following formula (1):

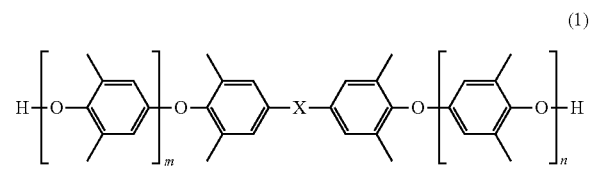

wherein, X represents an alkylene group having 1 to 3 carbon atoms or a direct bond, m represents 0 to 20, n represents 0 to 20, and a total of m and n is from 1 to 30.

3. The metal-clad laminated board according to claim 1, wherein the epoxy compound contains 50% by mass or more of a dicyclopentadiene epoxy compound.

4. The metal-clad laminated board according to claim 1, wherein the thermosetting resin composition further contains a cyanate ester compound.

5. The metal-clad laminated board according to claim 1, wherein the thermosetting resin composition further contains a halogen-based flame retardant.

6. The metal-clad laminated board according to claim 5, wherein the halogen-based flame retardant is a flame retardant to be dispersed without compatibilization in the thermosetting resin composition.

7. The metal-clad laminated board according to claim 5, wherein the halogen-based flame retardant has a melting point of 300° C. or higher.

8. The metal-clad laminated board according to claim 5, wherein the halogen-based flame retardant is at least one selected from the group consisting of ethylene dipentabromobenzene, ethylene bistetrabromoimide, decabromodiphenyloxide, tetradecabromodiphenoxybenzene, and bis(tribromophenoxy)ethane.

9. The metal-clad laminated board according to claim 1, wherein the thermosetting resin composition further contains an organometallic salt.

10. The metal-clad laminated board according to claim 1, wherein the thermosetting resin composition further contains an inorganic filler.

11. A method for producing a metal-clad laminated board according to claim 1, the method comprising: preparing a thermosetting resin composition containing a reaction product obtained by reacting at least a part of a polyphenylene ether having 1.5 to 2 hydroxyl groups on average in one molecule with an epoxy group of an epoxy compound having 2 to 2.3 epoxy groups on average in one molecule so that a terminal hydroxyl group concentration is 700 µmol/g or less; preparing a prepreg by impregnating a fibrous substrate with the thermosetting resin composition; and obtaining a metal-clad laminated board including an insulating layer and a metal layer in contact with at least one surface of the insulating layer by laminating the metal layer on the prepreg, followed by heat pressure molding, the insulating layer including a cured product of the thermosetting resin composition, wherein: the metal layer includes a metal substrate and a barrier layer containing cobalt, the barrier layer being provided on the metal substrate at a side adjacent to the metal layer with the insulating layer, and the contact surface has surface roughness of 2 µm or less in ten-point average roughness Rz.

12. A method for producing a wiring board, the method comprising obtaining a wiring board by using the metal-clad laminated board according to claim 1.

13. A resin-attached metal member comprising:
   an insulating layer; and
   a metal layer in contact with one surface of the insulating layer, wherein:
the insulating layer includes a half-cured product of a thermosetting resin composition containing a reaction product of a polyphenylene ether and an epoxy compound, the polyphenylene ether having 1.5 to 2 hydroxyl groups on average in one molecule, the epoxy compound having 2 to 2.3 epoxy groups on average in one molecule,
the reaction product has a terminal hydroxyl group concentration of 700 µmol/g or less,
the metal layer includes a metal substrate and a barrier layer containing cobalt, the barrier layer being provided on the metal substrate at a side adjacent to a contact surface of the metal layer with the insulating layer,
the contact surface has surface roughness of 2µm or less in ten-point average roughness Rz,
the barrier layer does not contain nickel, and
a transmission loss of a metal-clad laminated board obtained by curing the insulating layer is equal to or more than -37 dB/m, where the transmission loss is measured by applying a 15 GHz signal to a straight-line wiring that is formed from the metal layer of the metal-clad laminated board, the straight-line wiring having a length of 1000 mm and a width ranging from 100 µm to 200 µm.

14. A method for producing a resin-attached metal member, the method comprising:
   preparing a thermosetting resin composition containing a reaction product obtained by reacting at least a part of a polyphenylene ether having 1.5 to 2 hydroxyl groups on average in one molecule with an epoxy group of an epoxy compound having 2 to 2.3 epoxy groups on average in one molecule so that a terminal hydroxyl group concentration is 700 µmol/g or less; and
   obtaining a resin-attached metal member including an insulating layer and a metal layer in contact with one surface of the insulating layer by forming the thermosetting resin composition into a layer form on one surface of the metal layer, the insulating layer including a half-cured product of the thermosetting resin composition, wherein:
   the metal layer includes a metal substrate and a barrier layer containing cobalt, the barrier layer being provided on the metal substrate at a side adjacent to a contact surface of the metal layer with the insulating layer,
   the contact surface has surface roughness of 2 µm or less in ten-point average roughness Rz,
   the barrier layer does not contain nickel, and
   a transmission loss of a metal-clad laminated board obtained by curing the insulating layer is equal to or more than -37 dB/m, where the transmission loss is measured by applying a 15 GHz signal to a straight-line wiring that is formed from the metal layer of the metal-clad laminated board, the straight-line wiring having a length of 1000 mm and a width ranging from 100 µm to 200 µm.

15. A method for producing a wiring board, the method comprising obtaining a wiring board by using the resin-attached metal member according to claim 13.

* * * * *